(12) United States Patent
Geng et al.

(10) Patent No.: US 11,925,019 B2
(45) Date of Patent: Mar. 5, 2024

(54) CHANNEL STRUCTURES HAVING PROTRUDING PORTIONS IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Wanbo Geng, Wuhan (CN); Lei Xue, Wuhan (CN); Xiaoxin Liu, Wuhan (CN); Tingting Gao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 622 days.

(21) Appl. No.: 17/117,728

(22) Filed: Dec. 10, 2020

(65) Prior Publication Data
US 2022/0149069 A1 May 12, 2022

Related U.S. Application Data

(63) Continuation of application No. PCT/CN2020/127821, filed on Nov. 10, 2020.

(51) Int. Cl.
*H10B 43/27* (2023.01)
*H10B 43/10* (2023.01)

(52) U.S. Cl.
CPC ............ *H10B 43/27* (2023.02); *H10B 43/10* (2023.02)

(58) Field of Classification Search
CPC .............................. H10B 43/27; H10B 43/10
See application file for complete search history.

(56) References Cited

U.S. PATENT DOCUMENTS

| 8,815,676 B2 | 8/2014 | Yang et al. |
| 8,946,807 B2 | 2/2015 | Hopkins et al. |

(Continued)

FOREIGN PATENT DOCUMENTS

| CN | 105027285 A | 11/2015 |
| CN | 111263980 A | 6/2020 |

(Continued)

OTHER PUBLICATIONS

International Search Report issued in corresponding International Application No. PCT/CN2020/127822, dated Aug. 10, 2021, 5 pages.

(Continued)

*Primary Examiner* — Nathan W Ha
(74) *Attorney, Agent, or Firm* — BAYES PLLC

(57) ABSTRACT

A three-dimensional (3D) memory device includes a memory stack including conductive layers and dielectric layers interleaving the conductive layers, and a channel structure extending through the memory stack along a vertical direction. The channel structure has a plurality of protruding portions protruding along a lateral direction and facing the conductive layers, respectively, and a plurality of normal portions facing the dielectric layers, respectively, without protruding along the lateral direction. The channel structure includes a plurality of blocking structures in the protruding portions, respectively, and a plurality of storage structures in the protruding portions and over the plurality of blocking structures, respectively. A vertical dimension of each of the blocking structures is nominally the same as a vertical dimension of a respective one of the storage structures over the blocking structure.

20 Claims, 23 Drawing Sheets

(56) References Cited

U.S. PATENT DOCUMENTS

| | | | |
|---|---|---|---|
| 9,099,496 B2* | 8/2015 | Tian | H10B 41/27 |
| 9,230,974 B1* | 1/2016 | Pachamuthu | H10B 43/35 |
| 9,230,976 B2* | 1/2016 | Alsmeier | H10B 41/10 |
| 9,236,396 B1 | 1/2016 | Koka et al. | |
| 9,305,849 B1* | 4/2016 | Tsutsumi | H01L 29/40117 |
| 9,576,975 B2 | 2/2017 | Zhang et al. | |
| 9,659,955 B1* | 5/2017 | Sharangpani | H01L 21/02356 |
| 9,659,956 B1* | 5/2017 | Pachamuthu | H10B 43/27 |
| 9,875,929 B1* | 1/2018 | Shukla | H01L 29/40117 |
| 10,283,513 B1* | 5/2019 | Zhou | H10B 43/50 |
| 10,700,090 B1 | 6/2020 | Cui et al. | |
| 11,569,257 B2* | 1/2023 | Han | H10B 43/27 |
| 2007/0054448 A1 | 3/2007 | Choi et al. | |
| 2012/0083077 A1 | 4/2012 | Yang et al. | |
| 2013/0270624 A1 | 10/2013 | Yun et al. | |
| 2014/0203344 A1 | 7/2014 | Hopkins et al. | |
| 2015/0380424 A1 | 12/2015 | Makala et al. | |
| 2016/0043093 A1* | 2/2016 | Lee | H01L 29/1033 257/314 |
| 2016/0071860 A1* | 3/2016 | Kai | H10B 43/10 257/321 |
| 2016/0086972 A1* | 3/2016 | Zhang | H10B 43/35 438/269 |
| 2016/0163728 A1* | 6/2016 | Tsutsumi | H10B 41/27 257/66 |
| 2016/0172366 A1 | 6/2016 | Koka et al. | |
| 2016/0181271 A1* | 6/2016 | Yada | H10B 43/27 438/264 |
| 2017/0125436 A1* | 5/2017 | Sharangpani | H01L 21/0228 |
| 2018/0090373 A1 | 3/2018 | Sharangpani et al. | |
| 2018/0151588 A1* | 5/2018 | Tsutsumi | H01L 21/0228 |
| 2018/0374863 A1 | 12/2018 | Purayath | |
| 2019/0252405 A1 | 8/2019 | Tsutsumi | |

FOREIGN PATENT DOCUMENTS

| | | |
|---|---|---|
| CN | 111758164 A | 10/2020 |
| JP | 2010087272 A | 4/2010 |
| TW | 202021094 A | 6/2020 |

OTHER PUBLICATIONS

International Search Report issued in corresponding International Application No. PCT/CN2020/127821, dated Jun. 28, 2021, 4 pages.

* cited by examiner

CHANNEL STRUCTURES HAVING PROTRUDING PORTIONS IN THREE-DIMENSIONAL MEMORY DEVICE AND METHOD FOR FORMING THE SAME

CROSS-REFERENCE TO RELATED APPLICATIONS

This application is continuation of International Application No. PCT/CN2020/127821, filed on Nov. 10, 2020, entitled "CHANNEL STRUCTURES HAVING PROTRUDING PORTIONS IN THREE-DIMENSIONAL MEMORY DEVICE AND METHOD FOR FORMING THE SAME," which is hereby incorporated by reference in its entirety. This application is also related to co-pending U.S. application Ser. No. 17/117,744, filed on Dec. 10, 2020, entitled "CHANNEL STRUCTURES HAVING PROTRUDING PORTIONS IN THREE-DIMENSIONAL MEMORY DEVICE AND METHOD FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a memory stack including conductive layers and dielectric layers interleaving the conductive layers, and a channel structure extending through the memory stack along a vertical direction. The channel structure has a plurality of protruding portions protruding along a lateral direction and facing the conductive layers, respectively, and a plurality of normal portions facing the dielectric layers, respectively, without protruding along the lateral direction. The channel structure includes a plurality of blocking structures in the protruding portions, respectively, and a plurality of storage structures in the protruding portions and over the plurality of blocking structures, respectively. A vertical dimension of each of the blocking structures is nominally the same as a vertical dimension of a respective one of the storage structures over the blocking structure.

In another example, a 3D memory device includes a memory stack including conductive layers and dielectric layers interleaving the conductive layers, and a channel structure extending through the memory stack along a vertical direction. The channel structure includes a plurality of blocking structures disconnected from one another, and a plurality of storage structures over the plurality of blocking structures, respectively. Each of the storage structures extends between a respective pair of the dielectric layers and is in parallel with a respective one of the blocking structures.

In still another example, a method for forming a 3D memory device is disclosed. A stack structure including first layers and second layers interleaving the first layers is formed above a substrate. An opening extending vertically through the stack structure is formed. Parts of the second layers facing the opening are removed to form a plurality of recesses. A plurality of blocking structures are formed along sidewalls of the recesses. A plurality of storage structures are formed over the blocking structures, respectively, such that a vertical dimension of each of the blocking structures is nominally the same as a vertical dimension of a respective one of the storage structures over the blocking structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
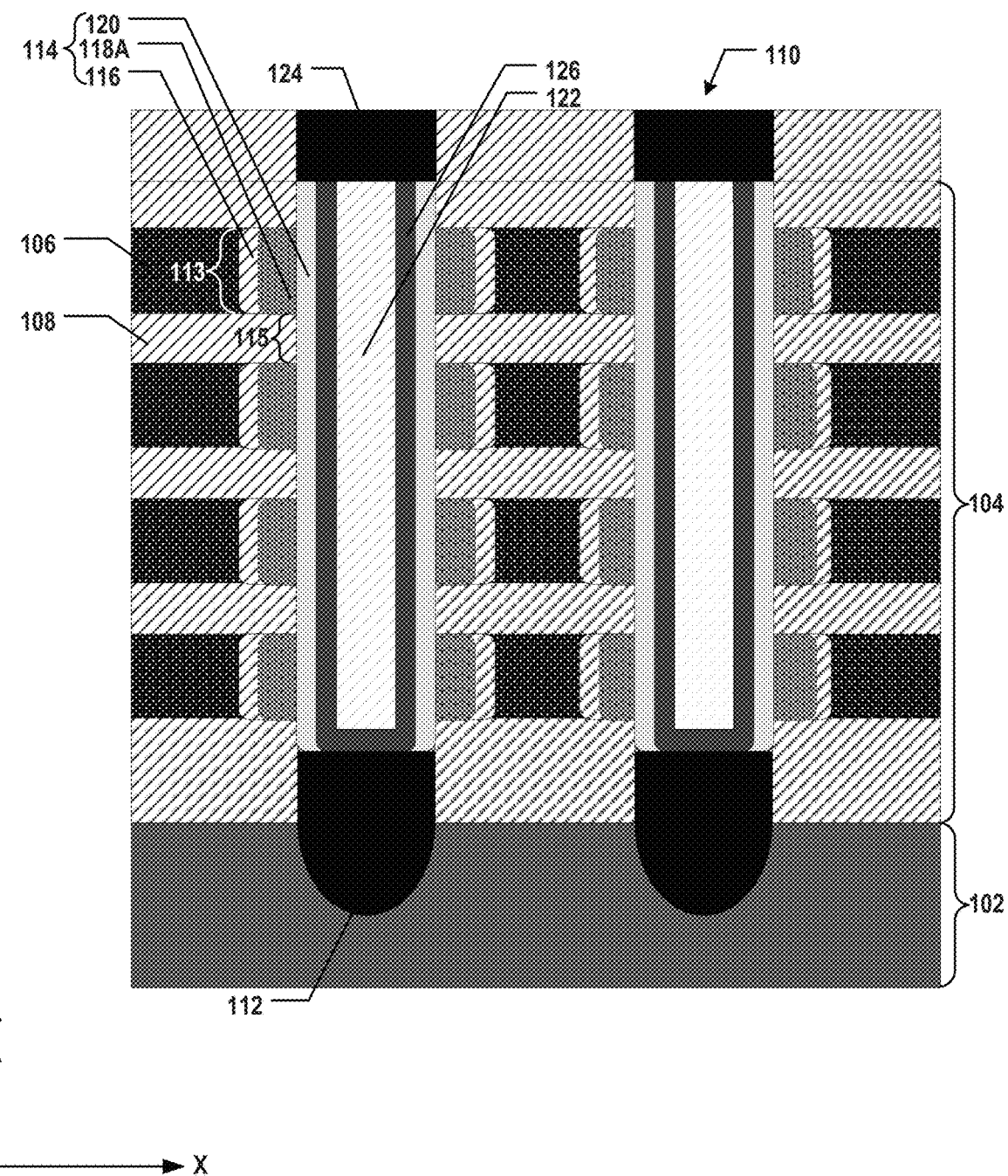
FIGS. 1A and 1B illustrate side views of cross-sections of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Charge trapping is a semiconductor memory technology used in some memory devices, such as 3D NAND memory devices, which uses a silicon nitride film as the storage layer to store electrons. In some memory devices, the charge trapping layer (e.g., a silicon nitride film) of one memory cell is usually not isolated from the charge trapping layer of another memory cell along a cell string. But instead, a charge trapping layer may be shared among multiple memory cells in a memory string. In the situation where a charge layer is shared among multiple memory cells, the charge trapped for one memory cell may spread to another memory cell, thereby causing charge spreading (also known as charge migration) between adjacent memory cells. Charge spreading may become a problem for data retention properties and cause disturb issues as the 3D memory devices continue to scale up vertically and the cell size and spacing shrink aggressively.

Figure 8:
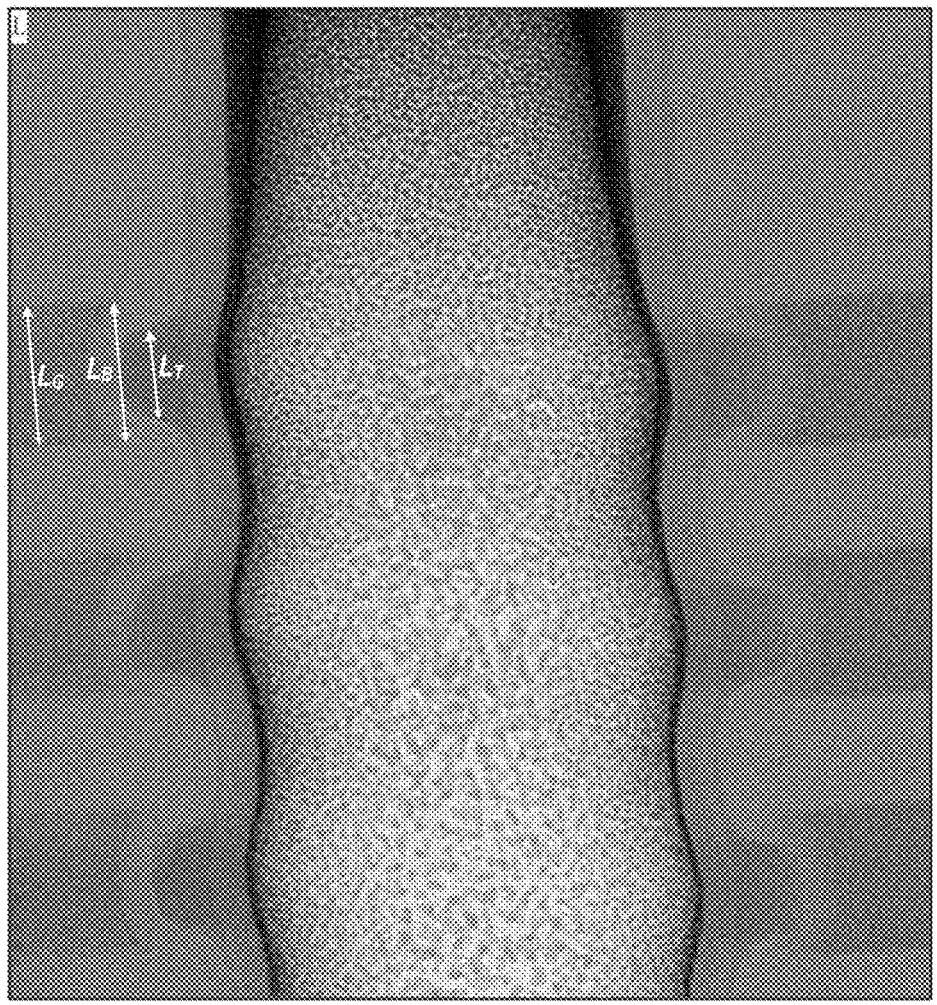
FIG. 8 illustrates an electron microscopy image of a channel structure.

One approach to avoiding the charge migration issue in the charge trapping layer is to cut the continuous silicon nitride film into separate portions for each memory cell, thereby physically preventing charge from spreading between memory cells. The sidewall of each channel structure formed by such an approach usually has a serpentine profile in the side view, and the continuous blocking layer (i.e., the outmost layer of the channel structure) over which the charge trapping layer forms follows the serpentine profile, for example, as shown in FIG. 8. As a result, in each memory cell, the vertical dimension of the respective portion of the charge trapping layer (e.g., the trap length $L_T$ in FIG. 8) becomes smaller than the vertical dimension of the respective portion of the blocking layer (e.g., the blocking length $L_B$ in FIG. 8) and the respective gate length (e.g., $L_G$ in FIG. 8). In other words, part of the serpentine blocking layer extends laterally between each portion of the charge trapping layer and the gate-to-gate dielectrics, making the trap length $L_T$ smaller than the gate length $L_G$. The difference between the trap length $L_T$ and the gate length $L_G$ and the extra blocking layer portions vertically between the charge trapping layer portion and the gate-to-gate dielectrics may cause uneven distribution of the electric field in each memory cell, thereby affecting the performance of the 3D memory device.

To address the aforementioned issues, the present disclosure introduces a solution in which a channel structure having protruding portions in a 3D memory device, which has nominally the same trap length and gate length. In some embodiments, a plurality of blocking structures disconnected from one another, instead of the continuous blocking layer following the serpentine profile of the channel structure in some known solutions, do not extend laterally to occupy the spaces between each storage portion and the gate-to-gate dielectrics, which reduces the trap length of the storage portion in the known solutions. As a result, the electric field in each memory cell can be more evenly distributed, making control of the memory cells more easily. The channel structure disclosed herein can be formed using various methods.

Figure 1B:
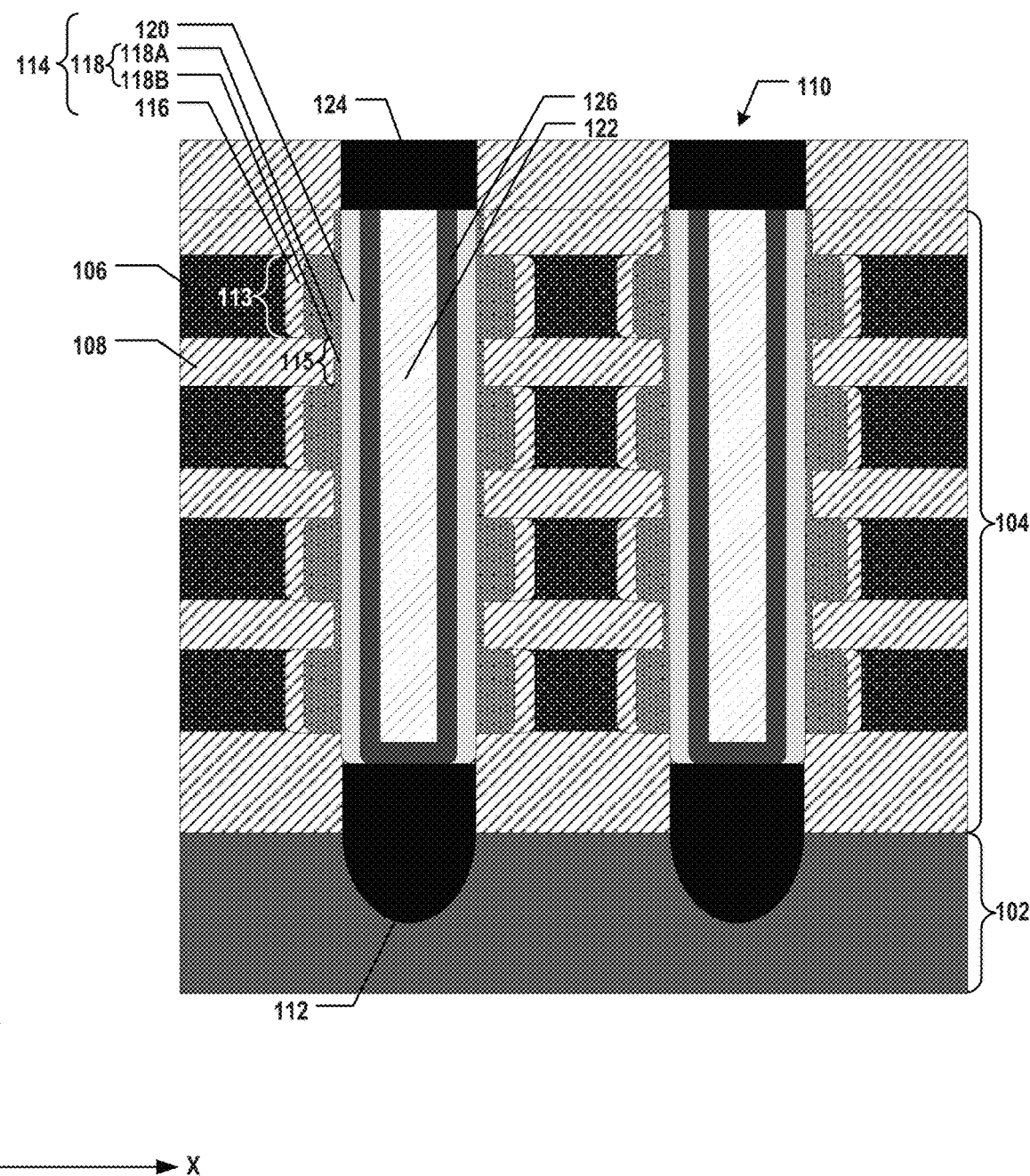

FIGS. 1A and 1B illustrate side views of cross-sections of an exemplary 3D memory device 100, according to some embodiments of the present disclosure. The 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. It is noted that x- and y-axes are included in FIGS. 1A and 1B to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing the spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in an array of NAND memory strings extending vertically above substrate 102. Each NAND memory string can be in the form of a channel structure 110 that extends through a plurality of pairs each including a conductive layer 106 and a dielectric layer 108 (referred to herein as "conductive/dielectric layer pairs"). The stacked conductor/dielectric layer pairs are also referred to herein as a "memory stack" 104. In some embodiments, a pad layer (not shown), such as a silicon oxide layer, is formed between substrate 102 and memory stack 104. The number (e.g., 32, 64, 96, 128, 160, 192, 224, 256, etc.) of the conductive/dielectric layer pairs in memory stack 104 can determine the number of memory cells in 3D memory device 100. Memory stack 104 can include a plurality of vertically interleaved conductive layers 106 and dielectric layers 108. Conductive layers 106 and dielectric layers 108 in memory stack 104 can alternate in the vertical direction. Conductive layers 106 can include conductive materials including, but not limited to, tungsten (W), cobalt (Co), copper (Cu), aluminum (Al), polysilicon, doped silicon, silicides, or any combination thereof. Each conductive layer 106 can include a gate electrode (gate line) surrounded by an adhesive layer and a gate dielectric layer. The gate electrode of conductive layer 106 can extend laterally as a word line, ending at one or more staircase structures of memory stack 104. Dielectric layers 108 can include dielectric materials including, but not limited to, silicon oxide, silicon nitride, silicon oxynitride, or any combination thereof. Although not shown, it is understood that in some embodiments, memory stack 104 has a multiple-deck architecture, which includes a plurality of memory decks stacked over one another to increase the number of the conductor/dielectric layer pairs.

As shown in FIGS. 1A and 1B, channel structure 110 can include a semiconductor plug 112 in the lower portion (e.g., at the lower end) of channel structure 110. As used herein, the "upper end" of a component (e.g., channel structure 110) is the end farther away from substrate 102 in the y-direction, and the "lower end" of the component (e.g., channel structure 110) is the end closer to substrate 102 in the y-direction when substrate 102 is positioned in the lowest plane of 3D memory device 100. Semiconductor plug 112 can include a single crystalline semiconductor material (also known as "monocrystalline semiconductor material"), such as single crystalline silicon, which in some instances is epitaxially grown from substrate 102 in any suitable directions. In a single crystalline material, the crystal lattice of the entire sample can be continuous and unbroken to the edges of the sample, with no grain boundaries. In some embodiments, semiconductor plug 112 includes single crystalline silicon, the same material of substrate 102. In other words, semiconductor plug 112 can include an epitaxially-grown semiconductor layer that is the same as the material of substrate 102. For example, substrate 102 may be a silicon substrate, and semiconductor plug 112 may be a single crystalline silicon plug. Semiconductor plug 112 can function as a channel controlled by a source select gate of channel structure 110.

As shown in FIGS. 1A and 1B, above semiconductor plug 112, channel structure 110 can have protruding portions 113 and normal portions 115 interleaving producing portions 113 in the vertical direction (e.g., the y-direction). Protruding portions 113 of channel structure 110 face conductive layers 106 of memory stack 104, and normal portions 115 of channel structure 110 face dielectric layers 108 of memory stack 104, according to some embodiments. In some embodiments, compared with normal portions 115, each protruding portion 113 protrudes into a respective conductive layer 106 laterally (e.g., in the x-direction in FIGS. 1A and 1B). In contrast, each normal portion 115 faces a respective dielectric layer 108 without protruding laterally, according to some embodiments. That is, the lateral dimension (e.g., in the x-direction in FIGS. 1A and 1B) of protruding portion 113 can be greater than the lateral dimension of normal portion 115 of channel structure 110. As a result, in some embodiments, the sidewall of channel structure 110 has a serpentine profile in the side view, as shown in FIGS. 1A and 1B.

As shown in FIGS. 1A and 1B, channel structure 110 can also include an opening filled with semiconductor material(s) (e.g., as a semiconductor channel 126) and dielectric material(s) (e.g., as a memory film 114). In some embodiments, memory film 114 is a composite layer above semiconductor plug 112 and along the sidewall of channel structure 110. It is understood that in some examples, the bottom of memory film 114 may further extend laterally over the top surface of semiconductor plug 112. In some embodiments, memory film 114 includes a plurality of blocking structures 116, a plurality of storage structures 118A, and a tunneling layer 120 from the sidewall toward the center of channel structure 110 in this order.

Different from the blocking layer in the known solutions, which is a continuous layer formed over and along the sidewall of a channel structure, following the serpentine profile of the sidewall of the channel structure in the side view, blocking structures 116 (also known as a blocking oxide) are discrete structures in protruding portions 113, but not in normal portions 115, of channel structure 110, according to some embodiments. That is, blocking structures are disconnected from one another in normal portions 115 of channel structure 110, i.e., not continuous in protruding portions 113 and normal portions 115, according to some embodiments. Blocking structure 116 can include silicon oxide, silicon oxynitride, high dielectric constant (high-k) dielectrics, or any combination thereof. In some embodiments, blocking structures 116 include silicon oxide. In some embodiments, a gate dielectric layer (not shown) is disposed laterally between each blocking structure 116 and a respective conductive layer 106. For example, the gate dielectric layer may include high-k dielectrics including, but not limited to, aluminum oxide ($Al_2O_3$), hafnium oxide ($HfO_2$), zirconium oxide ($ZnO_2$), tantalum oxide ($Ta_2O_5$), etc.

Multiple storage structures 118A (also known as a storage nitride) can be formed over multiple blocking structures 116, respectively. Storage structures 118A can include silicon nitride, silicon oxynitride, silicon, or any combination thereof. In some embodiments, storage structures 118A include silicon nitride. As shown in FIG. 1A, storage structures 118A are disposed in protruding portions 113 of channel structure 110, according to some embodiments. That is, each protruding portion 113 of channel structure 110 can include a respective blocking structure 116 and a respective storage structure 118A over blocking structure 116. Each storage structure 118A extends between a respective pair of dielectric layers 108 and is in parallel with a respective one of blocking structures 116, according to some embodiments. Different from the continues blocking layer in the known solutions, which extends laterally between the storage structure and the respective pair of the dielectric layers (i.e., the gate-to-gate dielectrics), disconnected blocking structures 116 do not occupy the space vertically between each storage structure 118A and a respective par of dielectric layers 108 (above and below storage structure 118A), according to some embodiments. As a result, each storage structure 118A can be vertically in contact with a respective pair of dielectric layers 108 of memory stack 104. Accordingly, the vertical dimension (i.e., the trap length $L_T$) of storage structure 118A is nominally the same as the vertical dimension (i.e., the blocking length $L_B$) of blocking structure 116, according to some embodiments. In some embodiments, since the vertical dimension (i.e., the blocking length $L_B$) of blocking structure 116 is nominally the same as the vertical dimension (i.e., the gate length $L_G$) of conductive layer 106 (i.e., the gate electrode of a memory cell), the vertical dimension (i.e., the trap length $L_T$) of storage structure 118A is nominally the same as the vertical dimension (i.e., the gate length $L_G$) of conductive layer 106 (i.e., the gate electrode) as well. This is different from the channel structure in the known solutions in which the trap length $L_T$ is smaller than the gate length $L_G$ and the blocking length $L_B$ (e.g., shown in FIG. 8).

Each storage structure 118A in protruding portion 113 can be coplanar with a respective conductive layer 106 and can be affected by the electric field generated by conductive layer 106 (i.e., the gate electrode of a memory cell). As a result, storage structure 118A can store charges, for example, electrons or holes from semiconductor channel 126. The storage or removal of charges in storage structure 118A can impact the on/off state and/or the conductance of semiconductor channel 126. Because each conductive layer 106 and a respective storage structure 118A can have nominally the same vertical dimension, the electric field created by conductive layer 106 and applied to storage structure 118A can be more uniform in channel structure 110, compared with known solutions, thereby making the control of the storage or removal of charges in storage structure 118A more easily.

Although storage structures 118A are shown as disconnected from one another in FIG. 1A, it is understood that in some examples, storage structures 118A may be parts of a continuous storage layer. For example, as shown in FIG. 1B, a storage layer 118 includes two types of structures with different thicknesses (e.g., in the x-direction in FIG. 1B): a plurality of storage structures 118A in protruding portions 113 of channel structure 110, and a plurality of protecting structures 118B connecting storage structures 118A in normal portions 115 of channel structure 110, according to some embodiments. In some embodiments, each protecting structure 118B in normal portion 115 of channel structure 110 is coplanar with a respective dielectric layer 108 (e.g., the gate-to-gate dielectric) and may not be affected by the electric field generated by conductive layer 106, according to some embodiments. Instead of storing charges, protecting structure 118B can connect adjacent storage structures 118A and protect dielectric layers 108 during the fabrication process of 3D memory device 100. In some embodiments, protecting structures 118B in normal portions 115 of channel structure 110 connect storage structures 118A in protruding portions 113 of channel structure 110, such that storage layer 118 is continuous. Protecting structures 118B and storage structures 118A can have the same material, such as silicon nitride.

It is understood that the thickness of each protecting structure 118B of storage layer 118 needs to be small enough to suppress the charge mitigation between adjacent storage structures 118A of storage layer 118. On the other hand, the thickness of protecting structure 118B of storage layer 118 cannot be too small in order to protect dielectric layers 108 underneath during the fabrication process. In some embodiments, the thickness of protecting structure 118B is between about 1 nm and about 5 nm, such as between 1 nm and 5 nm (e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values). The thickness of storage structure 118A can be greater than the thickness of protecting structure 118B due to the greater lateral dimension of protruding portion 113 of channel structure 110 than that of normal portion 115, which can allow the storage of charge herein. In some embodiments, the thickness of storage structure 118A is between about 10 nm and about 20 nm, such as between 10 nm and 20 nm (e.g., 10 nm, 11 nm, 12 nm, 13 nm, 14 nm, 15 nm, 16 nm, 17 nm, 18 nm, 19 nm, 20 nm, e.g., 1 nm, 1.5 nm, 2 nm, 2.5 nm, 3 nm, 3.5 nm, 4 nm, 4.5 nm, 5 nm, any range bounded by the lower end by any of these values, or in any range defined by any two of these values).

As shown in FIGS. 1A and 1B, tunneling layer 120 (also known as a tunnel oxide) can be formed over storage structures 118A. In some embodiments, the thickness of tunneling layer 120 is nominally the same over storage layer 118 (e.g., shown in FIG. 1B). Tunneling layer 120 is continuous in protruding portions 113 and in normal portions 115, according to some embodiments. Thus, the thicknesses of tunneling layer 120 in protruding portion 113 and normal portion 115 of channel structure 110 can be nominally the same. Charges, for example, electrons or holes from semiconductor channel 126 can tunnel through tunneling layer 120 to storage structures 118A. Tunneling layer 120 can include silicon oxide, silicon oxynitride, or any combination thereof. In some embodiments, blocking structure 116 includes silicon oxide, storage structure 118A includes silicon nitride, and tunneling layer 120 includes silicon oxide. Memory film 114 thus may be referred to as an "ONO" memory film for charge trapping-type of 3D NAND Flash memory.

As shown in FIGS. 1A and 1B, semiconductor channel 126 can be formed over tunneling layer 120. In some embodiments, the thickness of semiconductor channel 126 is nominally the same over tunneling layer 120. Semiconductor channel 126 is continuous in protruding portions 113 and in normal portions 115, according to some embodiments. Thus, the thicknesses of semiconductor channel 126 in protruding portion 113 and normal portion 115 of channel structure 110 can be nominally the same. Semiconductor channel 126 can provide charges, for example, electrons or holes, to storage structures 118A, tunneling through tunneling layer 120. Semiconductor channel 126 can include silicon, such as amorphous silicon, polysilicon, or single crystalline silicon. In some embodiments, semiconductor channel 126 includes polysilicon. As shown in FIGS. 1A and 1B, in some embodiments, the bottom portion of semiconductor channel 126 extends vertically through the bottom of tunneling layer 120 to be in contact with semiconductor plug 112, such that semiconductor plug 112 is electrically connected to semiconductor channel 126. In some embodiments, the remaining space of channel structure 110 is partially or fully filled with a capping layer 122 (with or without an air gap therein) including dielectric materials, such as silicon oxide. Capping layer 122 may be formed over semiconductor channel 126. In some embodiments, each memory cell of the NAND memory string includes a respective blocking structure 116, a respective storage structure 118A, and parts of tunneling layer 120 and semiconductor channel 126 in a respective protruding portion 113 of channel structure 110.

In some embodiments, channel structure 110 further includes a channel plug 124 in the upper portion (e.g., at the upper end) of channel structure 110. Channel plug 124 can be above and in contact with the upper end of semiconductor channel 126 to increase the contact area for bit line contact. Channel plug 124 can include semiconductor materials (e.g., polysilicon). By covering the upper end of channel structure 110 during the fabrication of 3D memory device 100, channel plug 124 can function as an etch stop layer to prevent etching of dielectrics filled in channel structure 110, such as silicon oxide and silicon nitride. In some embodiments, channel plug 124 also functions as part of the drain of the NAND memory string.

Although not shown in FIGS. 1A and 1B, it is understood that any other suitable components may be included as part of 3D memory device 100. For example, gate line slits, array common sources (ACSs), and local contacts, such as bit line contacts, word line contacts, and source line contacts, may be included in 3D memory device 100 for pad-out, i.e., electrically connecting channel structures 110 for metal routing to interconnects (e.g., middle-end-of-line (MEOL) interconnects and BEOL interconnects). In some embodiments, 3D memory device 100 further includes peripheral circuits, such as any suitable digital, analog, and/or mixed-signal peripheral circuits used for facilitating the operation of 3D memory device 100. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Figure 5:
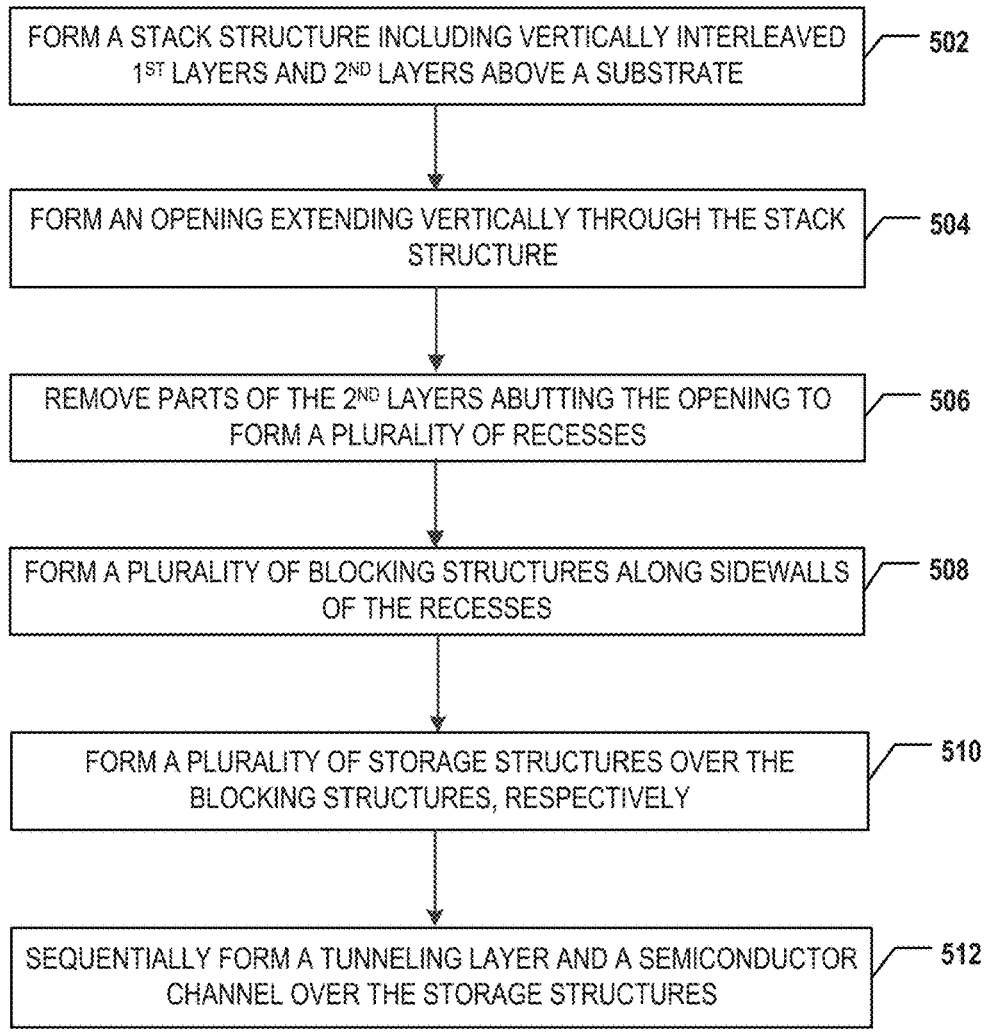
FIG. 5 illustrates a flowchart of an exemplary method for forming a 3D memory device, according to some embodiments of the present disclosure.

FIGS. 2A-2G illustrate an exemplary fabrication process for forming a 3D memory device, according to some embodiments of the present disclosure. FIG. 5 illustrates a flowchart of an exemplary method 500 for forming a 3D memory device, according to some embodiments of the present disclosure. Examples of the 3D memory device depicted in FIGS. 2A-2G and FIG. 5 includes 3D memory device 100 depicted in FIG. 1A. FIGS. 2A-2G and FIG. 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a stack structure is formed above a substrate. The substrate can be a silicon substrate. The stack structure can include a plurality of vertically interleaved first layers and second layers. In some embodiments, the stack structure includes a dielectric stack including vertically interleaved dielectric layers and sacrificial layers. In some embodiments, the first layers include silicon oxide, and the second layers include silicon nitride.

Figure 2A:
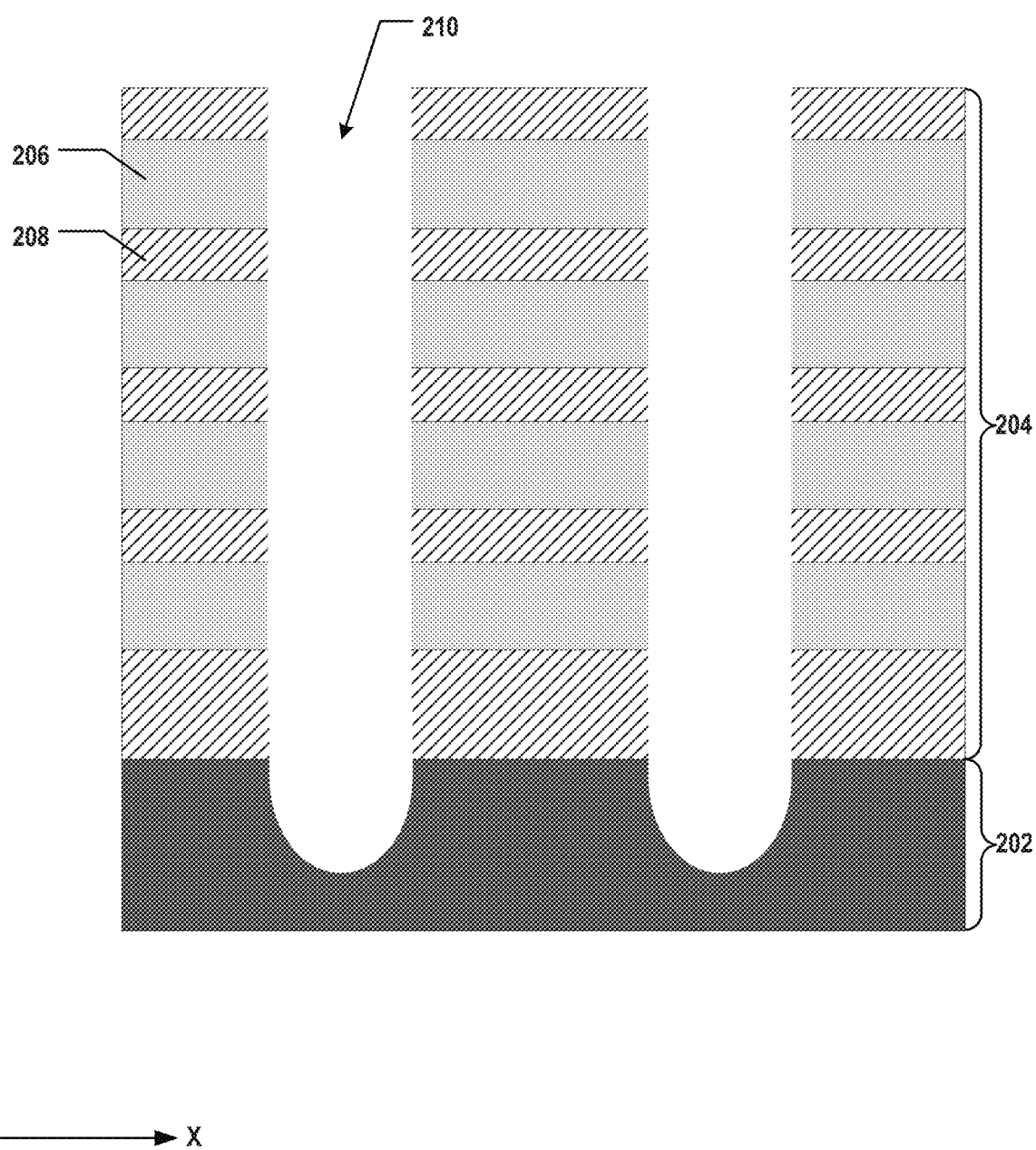
FIGS. 2A-2G illustrate an exemplary fabrication process for forming a 3D memory device, according to some embodiments of the present disclosure.

As illustrated in FIG. 2A, a dielectric stack 204 including vertically interleaved first dielectric layers 208 and second dielectric layers (referred to herein as "sacrificial layers" 206, together referred to herein as "dielectric layer pairs") are formed above a silicon substrate 202. In some embodiments, a pad layer (not shown) is formed between dielectric stack 204 and silicon substrate 202 by depositing dielectric materials, such as silicon oxide, or thermal oxidation, on silicon substrate 202 prior to the formation of dielectric stack 204. Dielectric layers 208 and sacrificial layers 206 can be alternatively deposited above silicon substrate 202 to form dielectric stack 204. In some embodiments, each dielectric layer 208 includes a layer of silicon oxide, and each sacrificial layer 206 includes a layer of silicon nitride. Dielectric stack 204 can be formed by one or more thin film deposition processes including, but not limited to, chemical vapor deposition (CVD), physical vapor deposition (PVD), atomic layer deposition (ALD), or any combination thereof. It is understood that in some examples, a stack structure including vertically interleaved dielectric layers 208 and conductive layers may be formed above silicon substrate 202. For example, each dielectric layer 208 may include a layer of silicon oxide, and each conductive layer may include a layer of polysilicon.

Method 500 proceeds to operation 504, as illustrated in FIG. 5, in which an opening is formed extending vertically through the dielectric stack. As illustrated in FIG. 2A, an opening 210 is formed extending vertically through dielectric stack 204. In some embodiments, a plurality of openings 210 are formed through dielectric stack 204, such that each opening 210 becomes the location for growing an individual channel structure in the later process. In some embodiments, fabrication processes for forming opening 210 include wet etching and/or dry etching, such as deep-ion reactive etching (DRIE). In some embodiments, opening 210 extends further through the top portion of silicon substrate 202. The etching process through dielectric stack 204 may not stop at the top surface of silicon substrate 202 and may continue to etch part of silicon substrate 202. In some embodiments, a separate etching process is used to etch part of silicon substrate 202 after etching through dielectric stack 204. As described above, it is understood that in some examples, opening 210 may be formed extending vertically through another type of stack structure including vertically interleaved dielectric layers 208 and conductive layers.

Figure 2B:
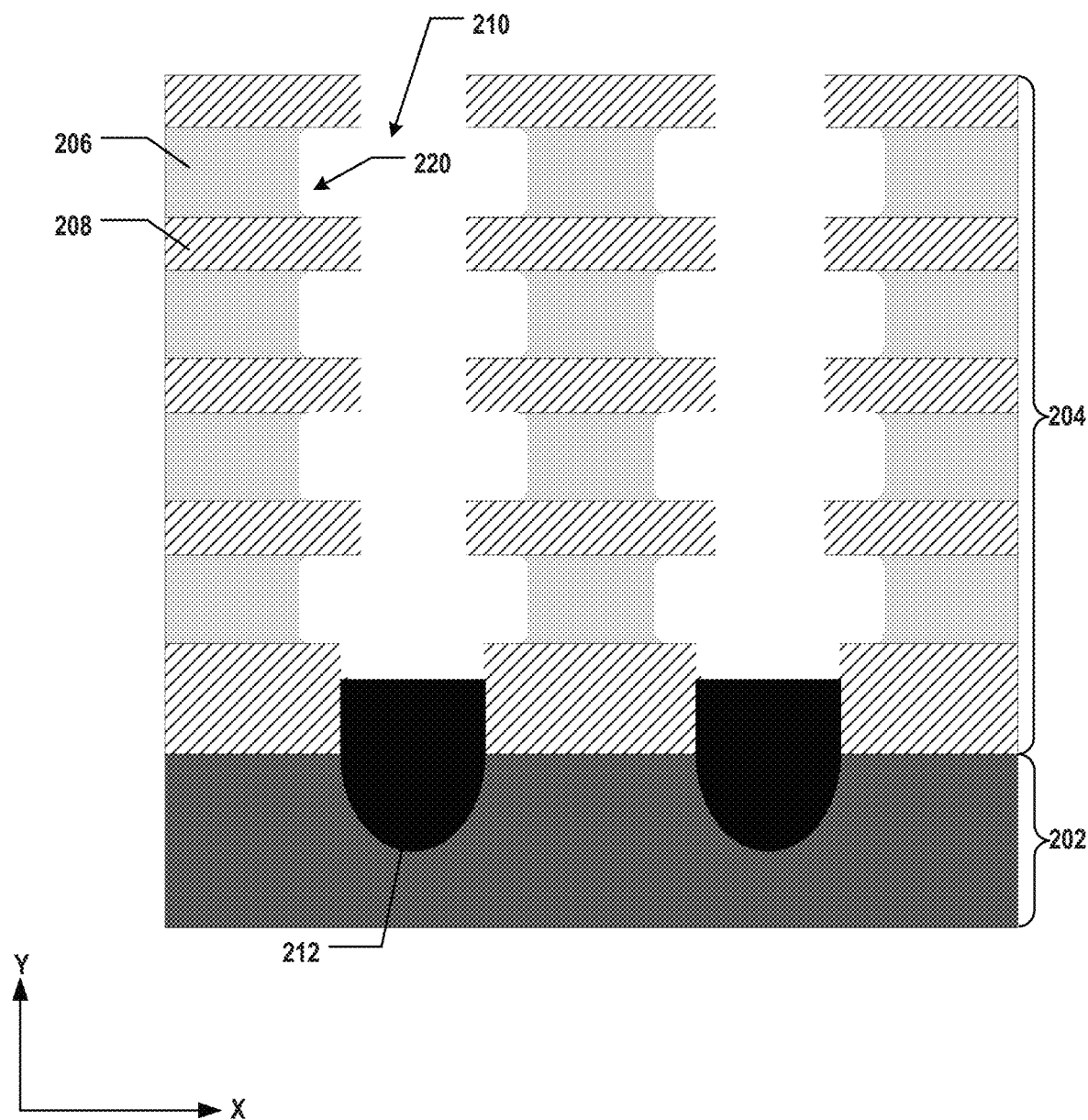

As illustrated in FIG. 2B, in some embodiments, a single crystalline silicon plug 212 is formed by selectively filling the lower portion of opening 210 with single crystalline silicon epitaxially grown from silicon substrate 202 in any suitable direction (e.g., from the bottom surface and/or side surface). The fabrication processes for growing single crystalline silicon plug 212 can include, but not limited to, vapor-phase epitaxy (VPE), liquid-phase epitaxy (LPE), molecular-beam epitaxy (MPE), or any combinations thereof.

Method 500 proceeds to operation 506, as illustrated in FIG. 5, in which parts of the second layers facing the opening are removed to form a plurality of recesses. In some embodiments, to remove the parts of the sacrificial layers, the parts of the second layers are wet etched selective to the first layers.

As shown in FIG. 2B, a plurality of recesses 220 are formed by removing parts of sacrificial layers 206 facing the sidewall of opening 210. Recesses 220 are formed laterally between sacrificial layers 206 and opening 210, according to some embodiments. Recesses 220 can be formed by etching back sacrificial layers 206 using wet etching selective to dielectric layers 208 through opening 210. In some embodiments in which sacrificial layers 206 include silicon nitride and dielectric layers 208 include silicon oxide, a wet etchant including phosphoric acid is applied through opening 210 to etch parts of sacrificial layers 206 facing opening 210 to form recesses 220. By controlling the etch rate and/or etch time, only parts of sacrificial layers 206 are etched with a desired lateral dimension, e.g., in the x-direction, according to some embodiments. As described above, it is understood that in some examples, a plurality of recesses 220 are formed by removing parts of the facing layers facing the sidewall of opening 210, for example, using wet etching selective to dielectric layers 208. In one example in which the conductive layers include polysilicon and dielectric layers 208 include silicon oxide, a wet etchant including tetramethylammonium hydroxide (TMAH) may be applied through opening 210 to etch parts of the conductive layers facing opening 210 to form recesses 220. It is also understood that in some examples, the wet etching process for forming recesses 220 may be part of a cleaning process prior to forming single crystalline silicon plug 212. That is, single crystalline silicon plug 212 may be formed after the formation of recesses 220.

Method 500 proceeds to operation 508, as illustrated in FIG. 5, in which a plurality of blocking structures are formed along sidewalls of the recesses. In some embodiments, to form the plurality of blocking structures, parts of remainders of the second layers abutting the sidewalls of the recesses are oxidized.

Figure 2C:
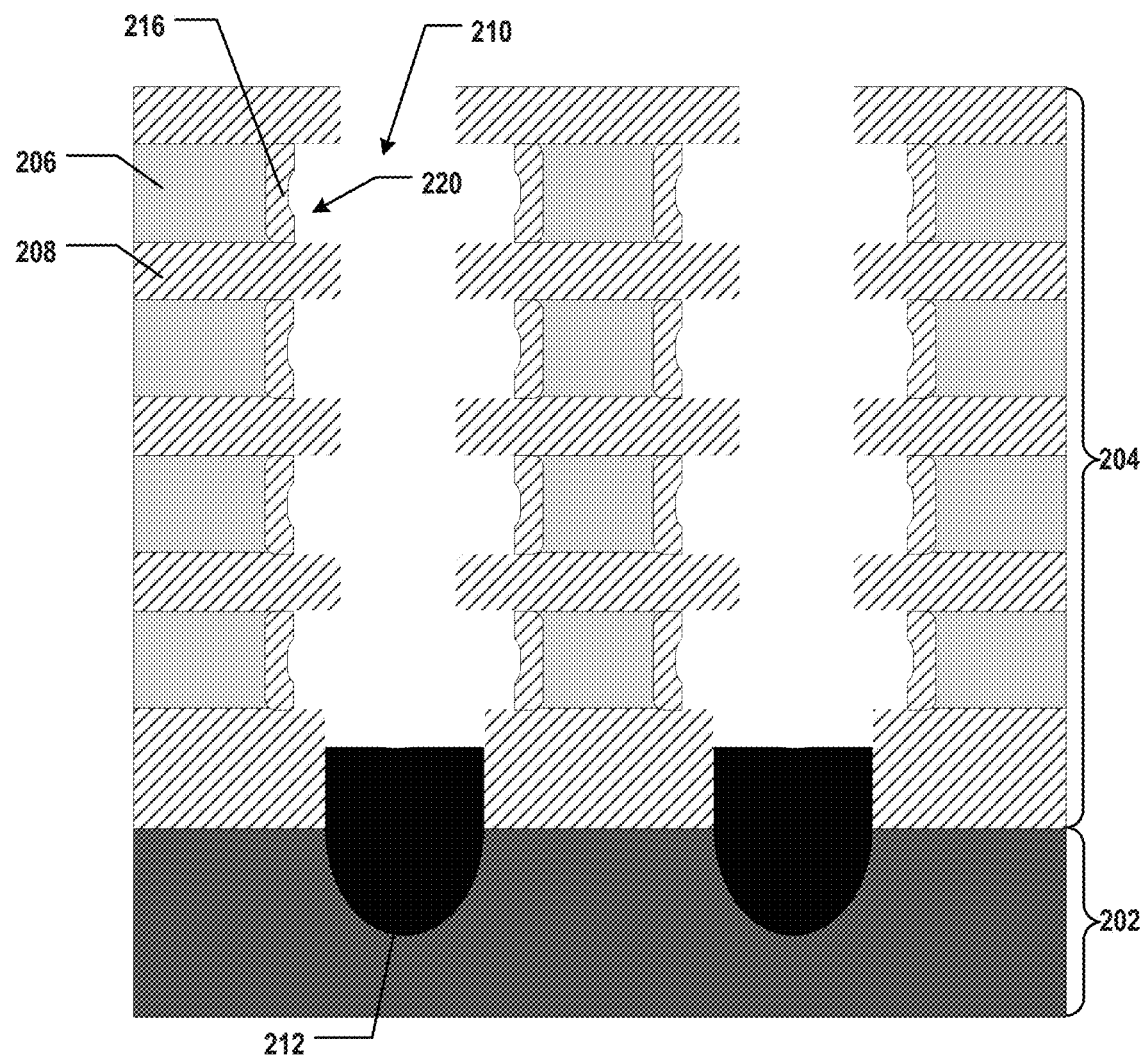

As illustrated in FIG. 2C, a plurality of blocking structures 216 are formed along the sidewalls of recesses 220, respectively. In some embodiments, a respective part of each sacrificial layer 206 (after etching) facing the sidewall of a respective recess 220 is oxidized to form native oxide as a respective blocking structure 216. The oxidation process can be performed by a thermal oxidation process and or a chemical oxidation process. In some embodiments in which sacrificial layer 206 includes silicon nitride, blocking structure 216 includes silicon oxide. It is understood that depending on the oxidization processes (e.g., the extent to which nitrogen atoms and ions are removed from the native oxide), blocking structure 216 can be entirely silicon oxide, entirely silicon oxynitride, and a mixture of silicon oxide and silicon oxynitride. In some embodiments, the part of sacrificial layer 206 is oxidized by a thermal oxidation process. Either dry oxidation using molecular oxygen as the oxidant or wet oxidation using water vapor as the oxidant can be used to form blocking structure 216 at a temperature, for example, not greater than about 850° C. For example, the thermal oxidation may include an in situ steam generation (ISSG) process, which uses oxygen gas and hydrogen gas to create water in the form of steam.

The oxidation process can be performed in a controlled manner such that only part of sacrificial layer 206 is oxidized, leaving the remainder of sacrificial layer 206 intact. The thickness of the resulting blocking structure 216 can be controlled by the thermal oxidation temperature and/or time. In some embodiments, the part of sacrificial layer 206 is oxidized by a chemical oxidation process, for example, including ozone. In some embodiments, the wet chemical is a mixture of hydrofluoric acid and ozone (e.g., FOM). The thickness of resulting blocking structure 216 can be controlled by the wet chemical compositions, temperature, and/or time. As described above, it is understood that in some examples, parts of the conductive layers (e.g., polysilicon layers) of another type of stack structure may be oxidized to form blocking structures 216 (e.g., including silicon oxide) along the sidewalls of recesses 220.

Figure 3A:
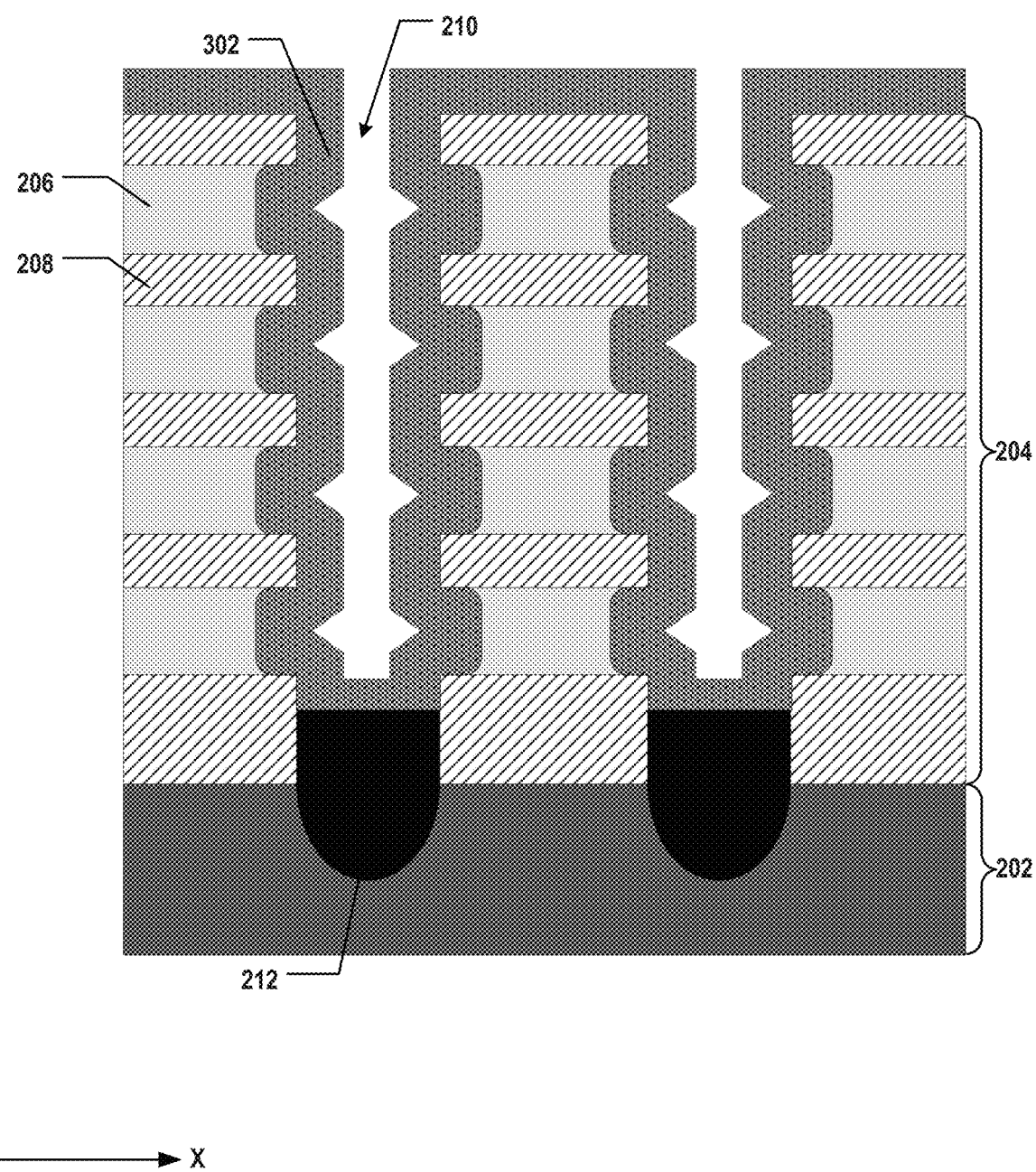
FIGS. 3A-3C illustrate an exemplary fabrication process for forming blocking structures in a 3D memory device, according to some embodiments of the present disclosure.
Figure 3B:
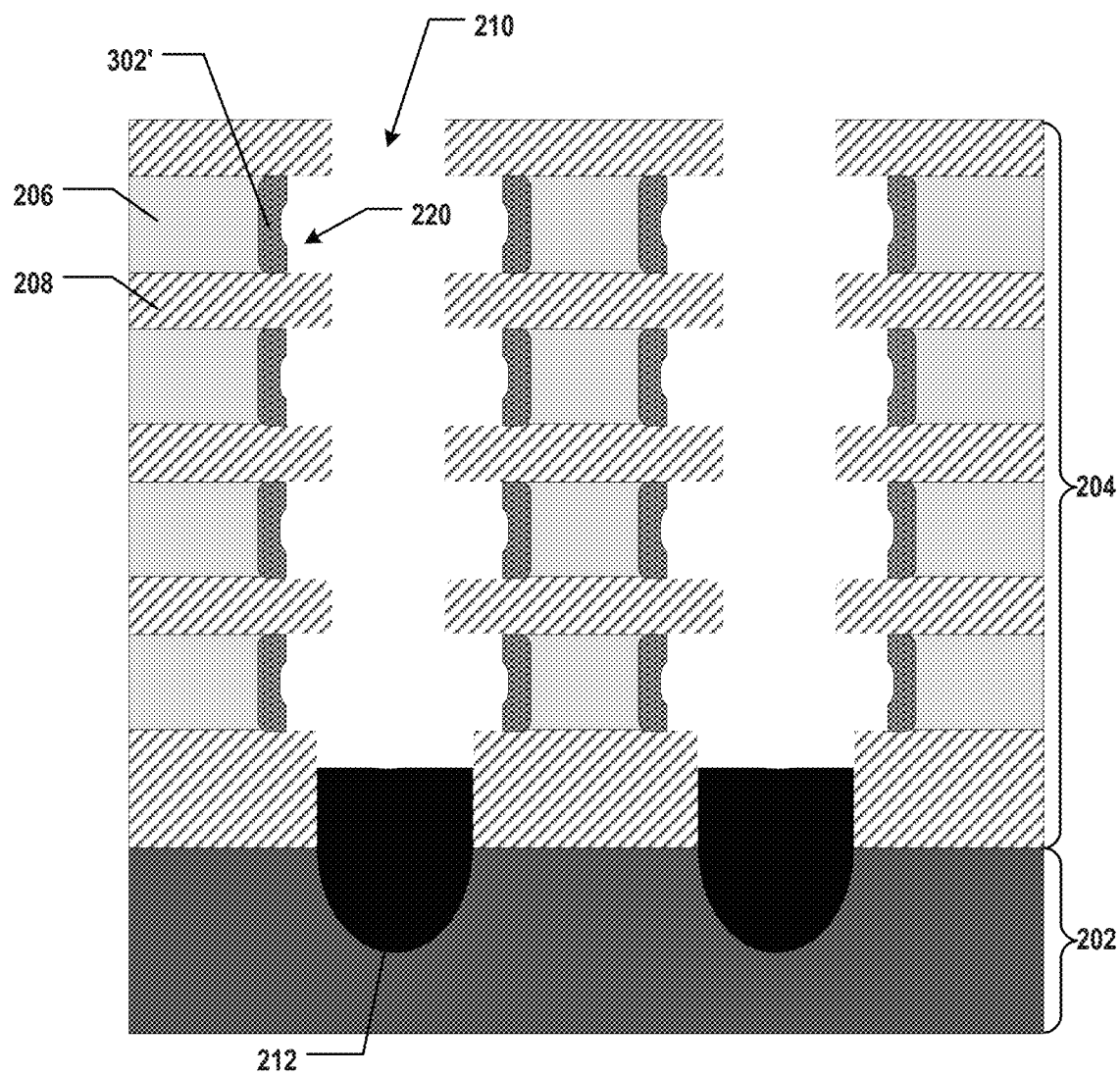
Figure 3C:
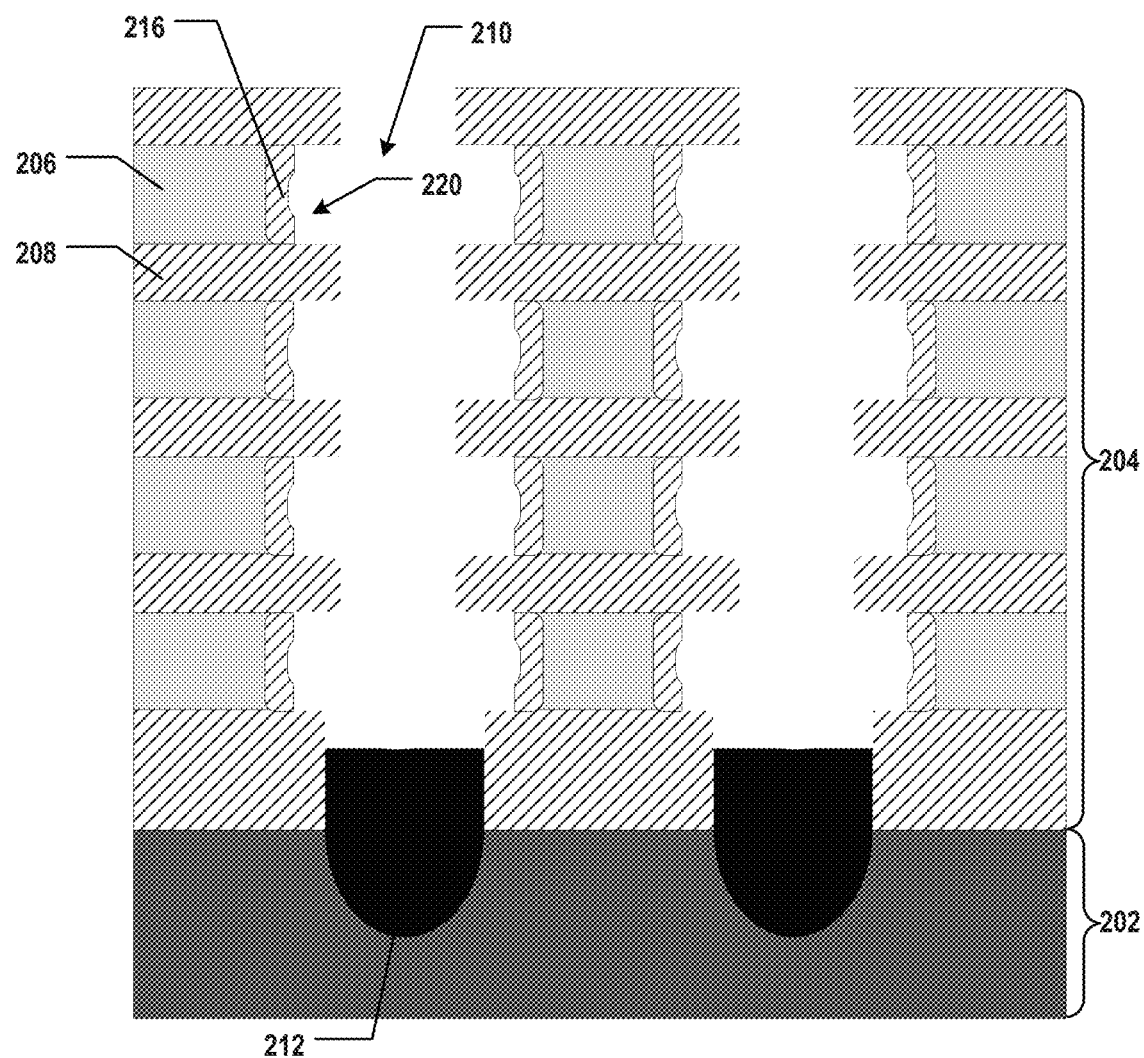
Figure 6A:
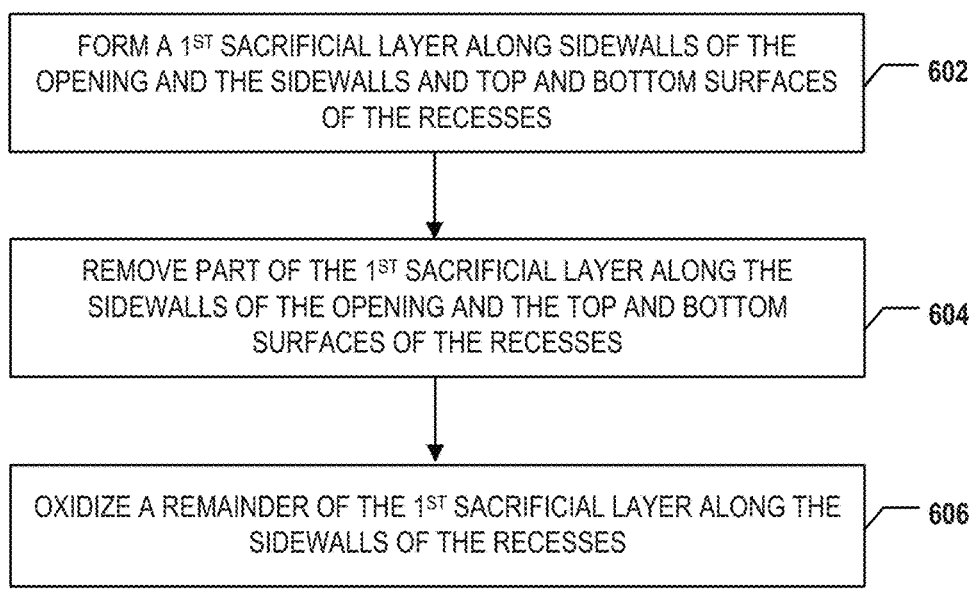
FIG. 6A illustrates a flowchart of an exemplary method for forming blocking structures in a 3D memory device, according to some embodiments of the present disclosure.

The formation of the blocking structures along the sidewalls of the recesses is not limited by the example described above with respect to FIGS. 2B and 2C. FIGS. 3A-3C illustrate an exemplary fabrication process for forming the blocking structures in a 3D memory device, according to some embodiments of the present disclosure. FIG. 6A illustrates a flowchart of an exemplary method 600 for forming the blocking structures in a 3D memory device, according to some embodiments of the present disclosure.

Referring to FIG. 6A, method 600 starts at operation 602, in which a first sacrificial layer is formed along sidewalls of the opening and the sidewalls and top and bottom surfaces of the recesses. In some embodiments, the first sacrificial layer includes silicon nitride. As illustrated in FIG. 3A, a sacrificial layer 302 is formed along the sidewalls of opening 210 and the sidewalls and the top and bottom surfaces of recesses 220 (e.g., shown in FIG. 2B). In some embodiments, sacrificial layer 302 is formed by depositing a layer of silicon nitride using one or more thin film deposition processes, such as ALD, CVD, PVD, any other suitable processes, or any combination thereof through opening 210. In some embodiments, an ALD process is used to precisely control the thickness of sacrificial layer 302, such that sacrificial layer 302 covers the sidewalls of opening 210 and the sidewalls and the top and bottom surfaces of recesses 220.

Method 600 proceeds to operation 604, as illustrated in FIG. 6A, in which part of the first sacrificial layer along the sidewalls of the opening and the top and bottom surfaces of the recesses is removed. In some embodiments, to remove the part of the first sacrificial layer, the part of the first sacrificial layer is wet etched selective to the first layers. As illustrated in FIG. 3B, part of sacrificial layer 302 (e.g., shown in FIG. 3A) along the sidewalls of opening 210 and the top and bottom surfaces of recesses 220 is removed, leaving the remainder 302' of sacrificial layer 302 along the sidewalls of recesses 220 in contact with sacrificial layers 206. In some embodiments, the part of sacrificial layer 302 along the sidewalls of opening 210 and the top and bottom surfaces of recesses 220 is removed by wet etching sacrificial layer 302 selective to dielectric layers 208. In some embodiments in which sacrificial layer 302 includes silicon nitride and dielectric layers 208 include silicon oxide, a wet etchant including phosphoric acid is applied through opening 210 to etch sacrificial layer 302. The etching rate and/or etching time can be controlled such that the part of sacrificial layer 302 along the sidewalls of opening 210 and the top and bottom surfaces of recesses 220 is removed, leaving the remainder 302' of sacrificial layer 302 along the sidewalls of recesses 220.

Method 600 proceeds to operation 606, as illustrated in FIG. 6A, in which a remainder of the first sacrificial layer along the sidewalls of the recesses is oxidized. As illustrated in FIG. 3C, remainder 302' of sacrificial layer 302 along the sidewalls of recesses 220 is oxidized to form blocking structures 216. The oxidation process can be performed by a thermal oxidation process and or a chemical oxidation process. The oxidation process can be performed in a controlled manner such that only remainder 302' of sacrificial layer 302 is oxidized, leaving sacrificial layers 206 intact, as described above in detail. It is understood that the process described above for forming blocking structures 216 with respect to FIGS. 3A-3C and 6A may be similarly applied to another type of stack structure including vertically interleaved dielectric layers 208 and the conductive layers as well.

Figure 6B:
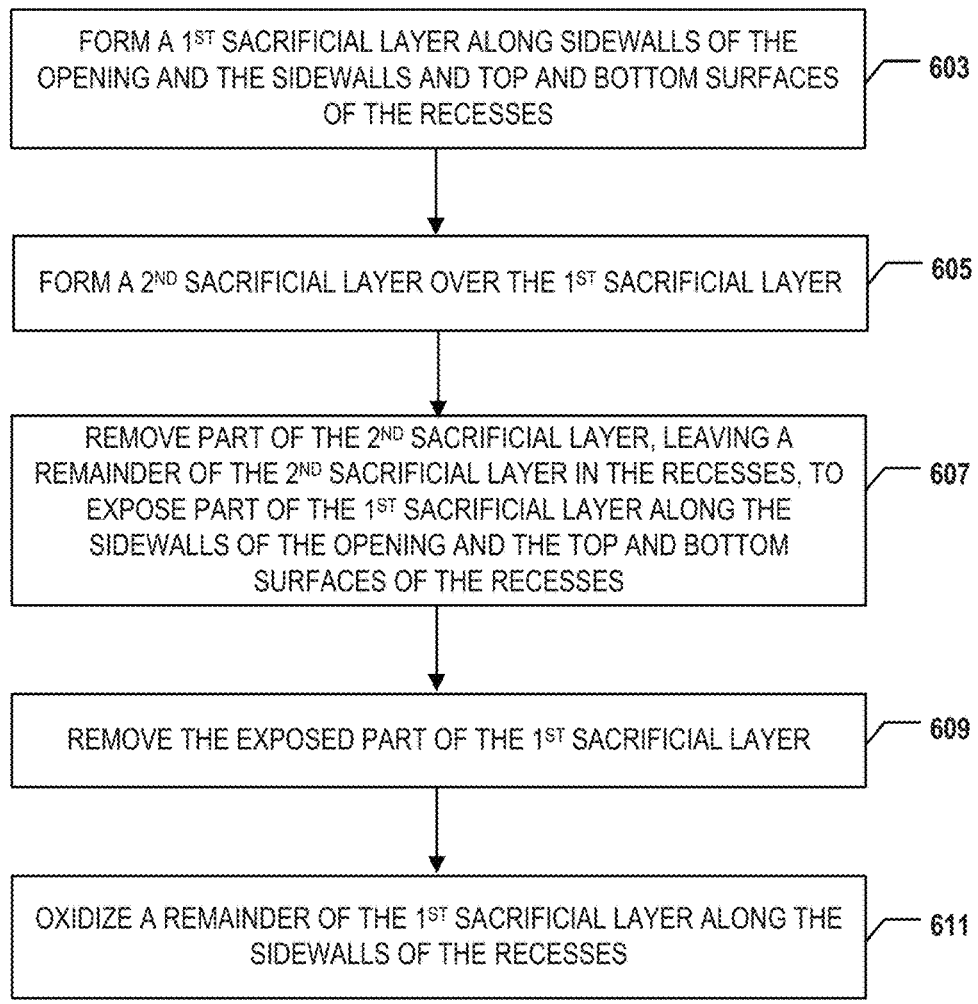
FIG. 6B illustrates a flowchart of another exemplary method for forming blocking structures in a 3D memory device, according to some embodiments of the present disclosure.

FIGS. 4A-4F illustrate another exemplary fabrication process for forming the blocking structures in a 3D memory device, according to some embodiments of the present disclosure. FIG. 6B illustrates a flowchart of another exemplary method 601 for forming the blocking structures in a 3D memory device, according to some embodiments of the present disclosure.

Figure 4A:
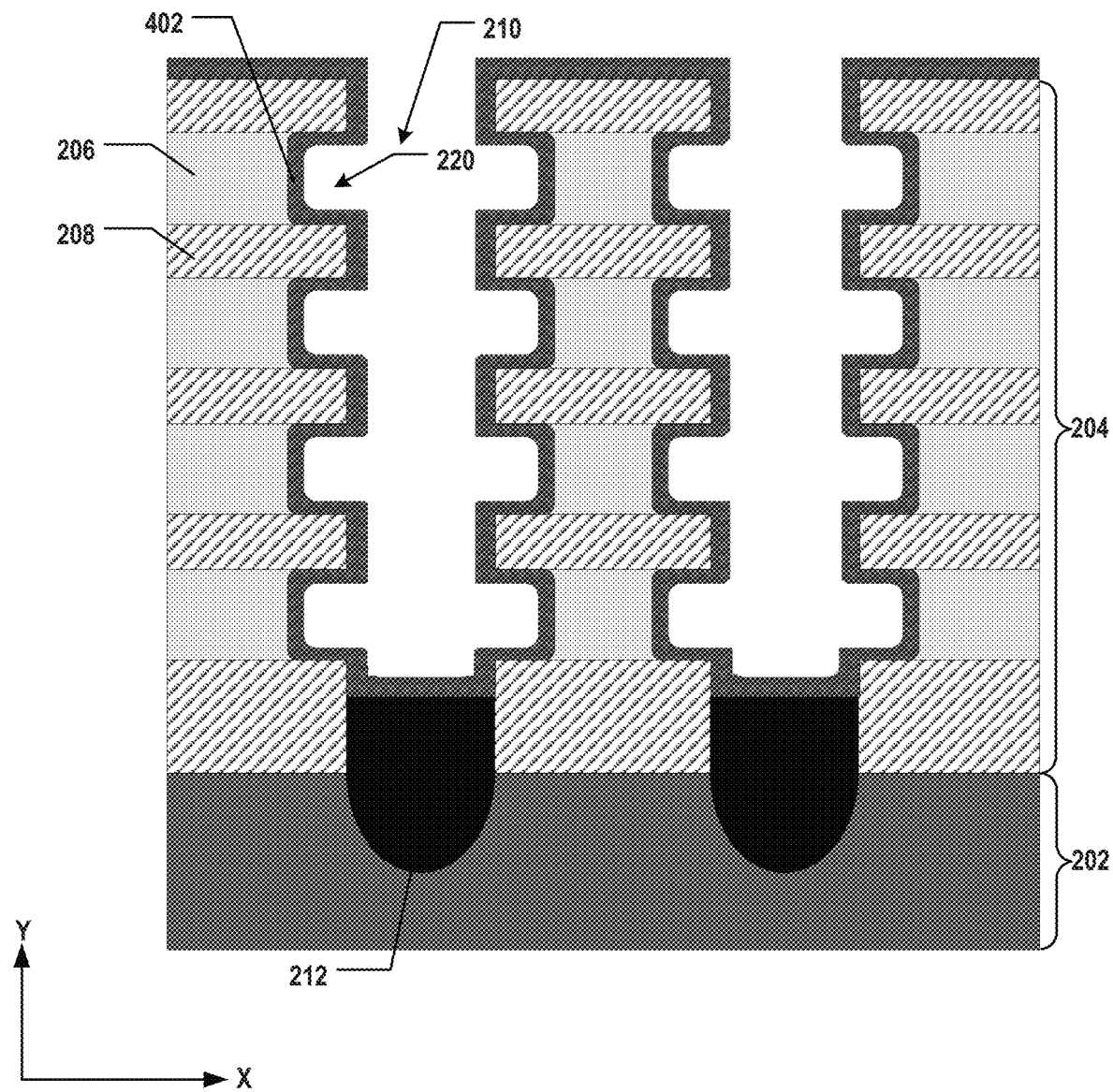
FIGS. 4A-4F illustrate another exemplary fabrication process for forming blocking structures in a 3D memory device, according to some embodiments of the present disclosure.

Referring to FIG. 6B, method 601 starts at operation 603, in which a first sacrificial layer is formed along sidewalls of the opening and the sidewalls and top and bottom surfaces of the recesses. In some embodiments, the first sacrificial layer includes silicon nitride. As illustrated in FIG. 4A, a sacrificial layer 402 is formed along the sidewalls of opening 210 and the sidewalls and the top and bottom surfaces of recesses 220 (e.g., shown in FIG. 2B). In some embodiments, sacrificial layer 402 is formed by depositing a layer of silicon nitride using one or more thin film deposition processes, such as ALD, CVD, PVD, any other suitable processes, or any combination thereof through opening 210. In some embodiments, an ALD process is used to precisely control the thickness of sacrificial layer 402, such that sacrificial layer 402 covers the sidewalls of opening 210 and the sidewalls and the top and bottom surfaces of recesses 220. Compared with sacrificial layer 302 in FIG. 3A, which may fully fill recesses 220, the thickness of sacrificial layer 402 in FIG. 4A may be smaller than that of sacrificial layer 302, such that sacrificial layer 402 may not fully fill recesses 220, leaving space for future processes (e.g., forming another sacrificial layer).

Figure 4B:
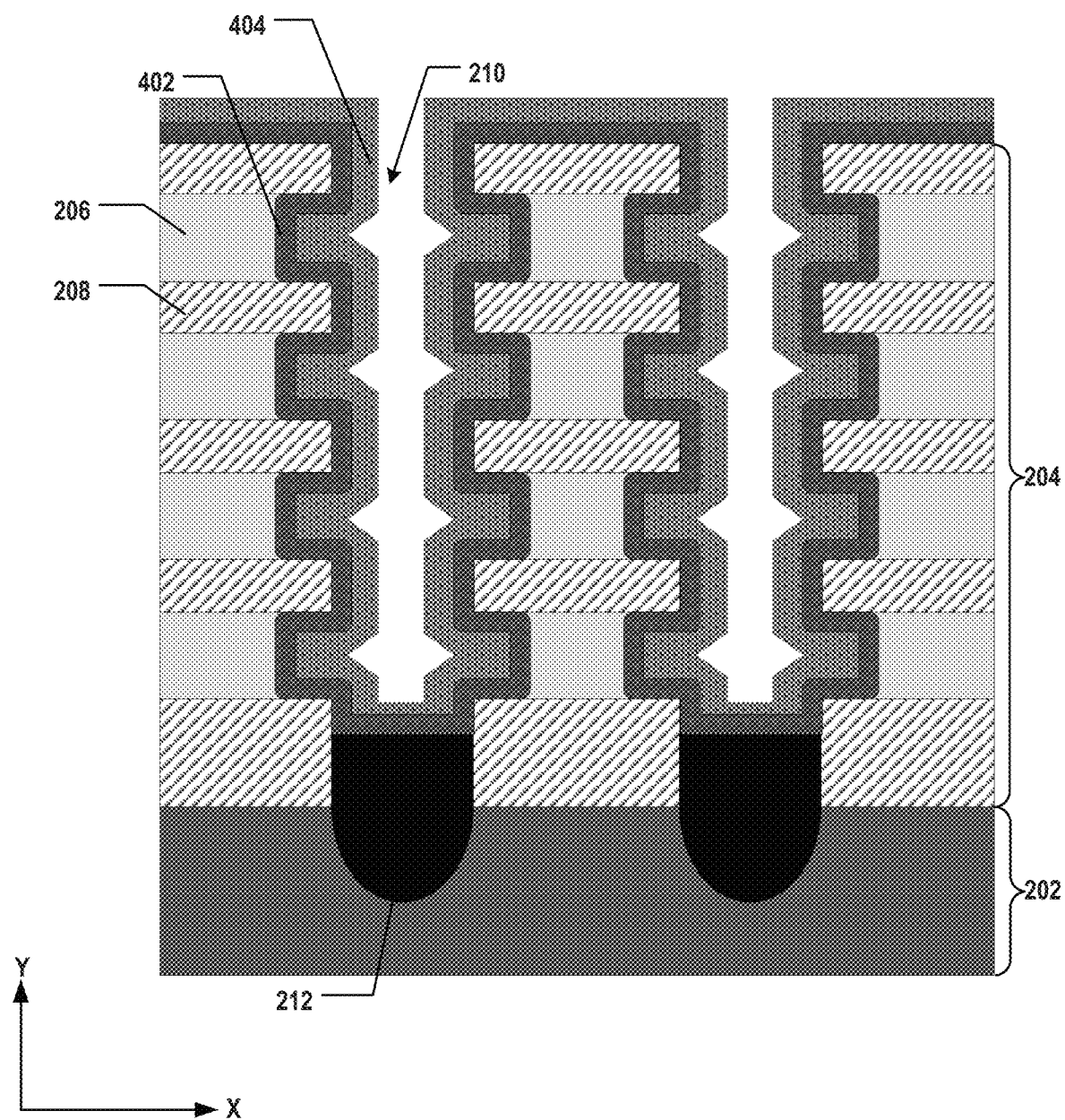

Method 601 proceeds to operation 605, as illustrated in FIG. 6B, in which a second sacrificial layer is formed over the first sacrificial layer. In some embodiments, the second sacrificial layer includes polysilicon. As illustrated in FIG. 4B, a sacrificial layer 404 is formed over sacrificial layer 402. In some embodiments, sacrificial layer 404 is formed by depositing a layer of polysilicon (or any other suitable material different from the material of sacrificial layer 402) using one or more thin film deposition processes, such as ALD, CVD, PVD, any other suitable processes, or any combination thereof through opening 210. In some embodiments, an ALD process is used to precisely control the thickness of sacrificial layer 404, such that sacrificial layer 404 fully covers sacrificial layer 402 along the sidewalls of opening 210 and the sidewalls and the top and bottom surfaces of recesses 220.

Figure 4C:
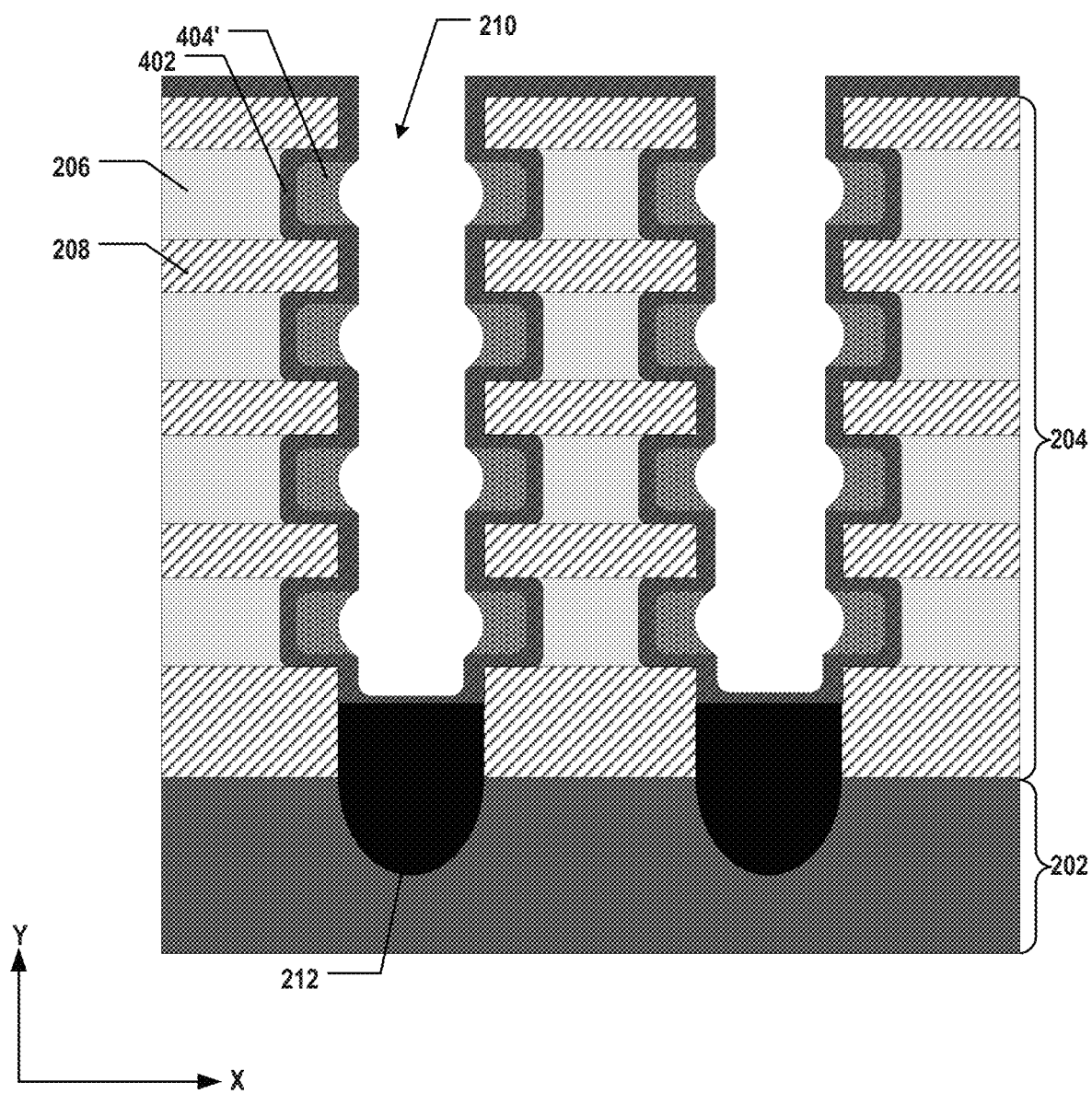

Method 601 proceeds to operation 607, as illustrated in FIG. 6B, in which part of the second sacrificial layer is removed, leaving a remainder of the second sacrificial layer in the recesses, to expose part of the first sacrificial layer along the sidewalls of the opening and the top and bottom surfaces of the recesses. In some embodiments, to remove the part of the second sacrificial layer, the part of the second sacrificial layer is wet etched selective to the first sacrificial layer. As illustrated in FIG. 4C, part of sacrificial layer 404 (e.g., shown in FIG. 4B) along the sidewalls of opening 210 and the top and bottom surfaces of recesses 220 is removed, leaving the remainder 404' of sacrificial layer 404 in recesses 220 (e.g., shown in FIG. 2B), to expose part of sacrificial layer 402 along the sidewalls of opening 210 and the top and bottom surfaces of recesses 220. In some embodiments, the part of sacrificial layer 404 along the sidewalls of opening 210 and the top and bottom surfaces of recesses 220 is removed by wet etching sacrificial layer 404 selective to sacrificial layer 402. In some embodiments in which sacrificial layer 404 includes polysilicon and sacrificial layer 402 includes silicon nitride, a wet etchant including TMAH is applied through opening 210 to etch sacrificial layer 404. The etching rate and/or etching time can be controlled such that the part of sacrificial layer 404 along the sidewalls of opening 210 is removed, leaving remainder 404' of sacrificial layer 404 in recesses 220. As shown in FIG. 4C, remainder 404' of sacrificial layer 404 in recesses 220 can cover part of sacrificial layer 402 along the sidewalls of recesses 220.

Method 601 proceeds to operation 609, as illustrated in FIG. 6B, in which the exposed part of the first sacrificial layer is removed. In some embodiments, to remove the exposed part of the first sacrificial layer, the exposed part of the first sacrificial layer is wet etched selective to the remainder of the second sacrificial layer and the first layers.

Figure 4D:
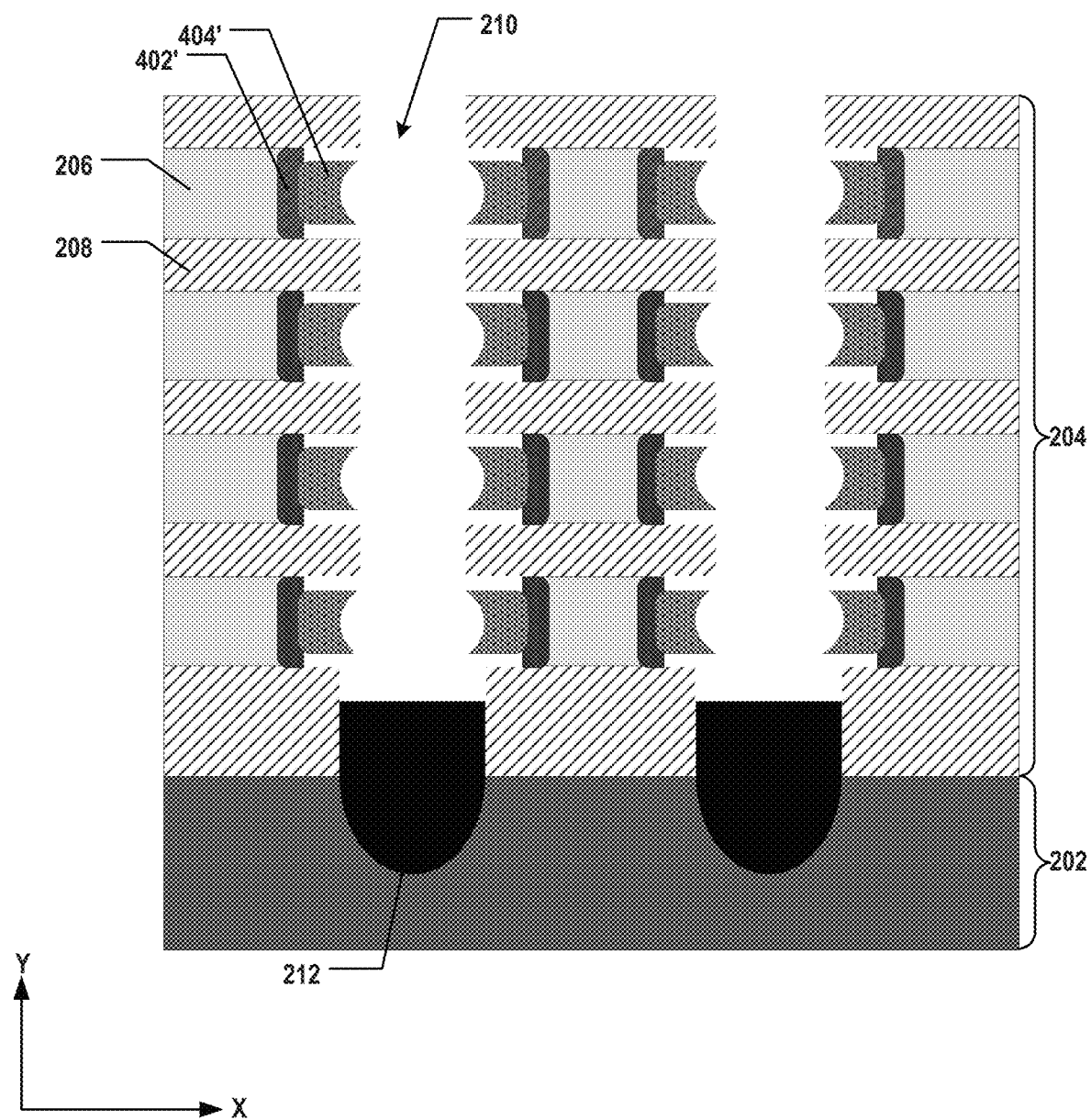

As illustrated in FIG. 4D, the exposed part of sacrificial layer 402 (e.g., shown in FIG. 4C) along the sidewalls of opening 210 and the top and bottom surfaces of recesses 220 is removed, leaving the remainder 402' of sacrificial layer 402 along the sidewalls of recesses 220 intact. In some embodiments, the exposed part of sacrificial layer 402 is removed by wet etching the exposed part of sacrificial layer 402 selective to dielectric layers 208 and remainder 404' of sacrificial layer 404. In some embodiments in which sacrificial layer 404 includes polysilicon, sacrificial layer 402 includes silicon nitride, and dielectric layers 208 include silicon oxide, a wet etchant including phosphoric acid is applied through opening 210 to etch sacrificial layer 402. Remainder 404' of sacrificial layer 404 can act as the etch mask to protect remainder 402' of sacrificial layer 402 along the sidewalls of recesses 220 (i.e., in contact with sacrificial layers 206) during the etching. The etching rate and/or etching time can also be controlled such that the part of sacrificial layer 402 along the sidewalls of opening 210 and the top and bottom surfaces of recesses 220 is removed, leaving remainder 402' of sacrificial layer 402 along the sidewalls of recesses 220.

Figure 4E:
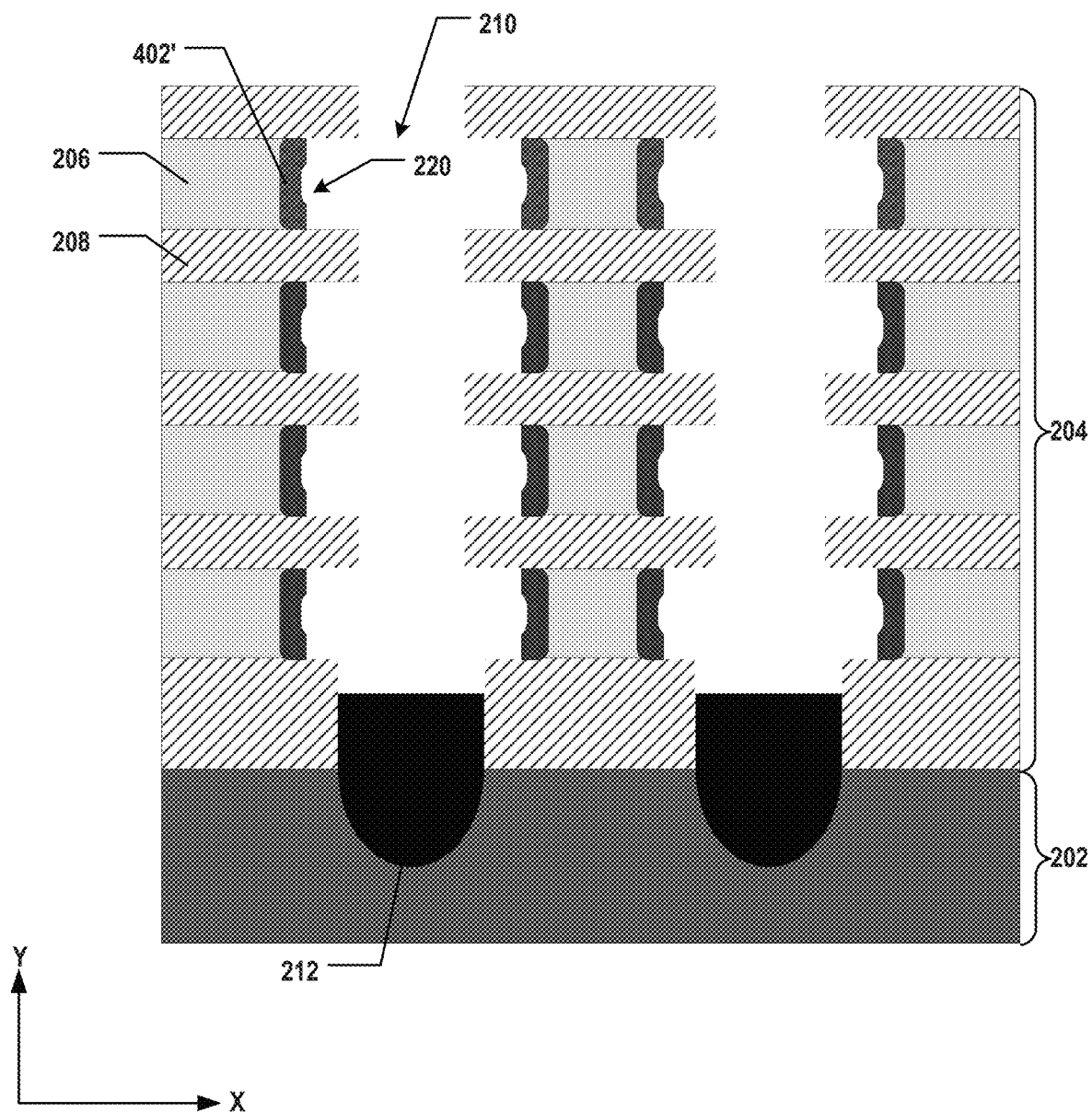
Figure 4F:
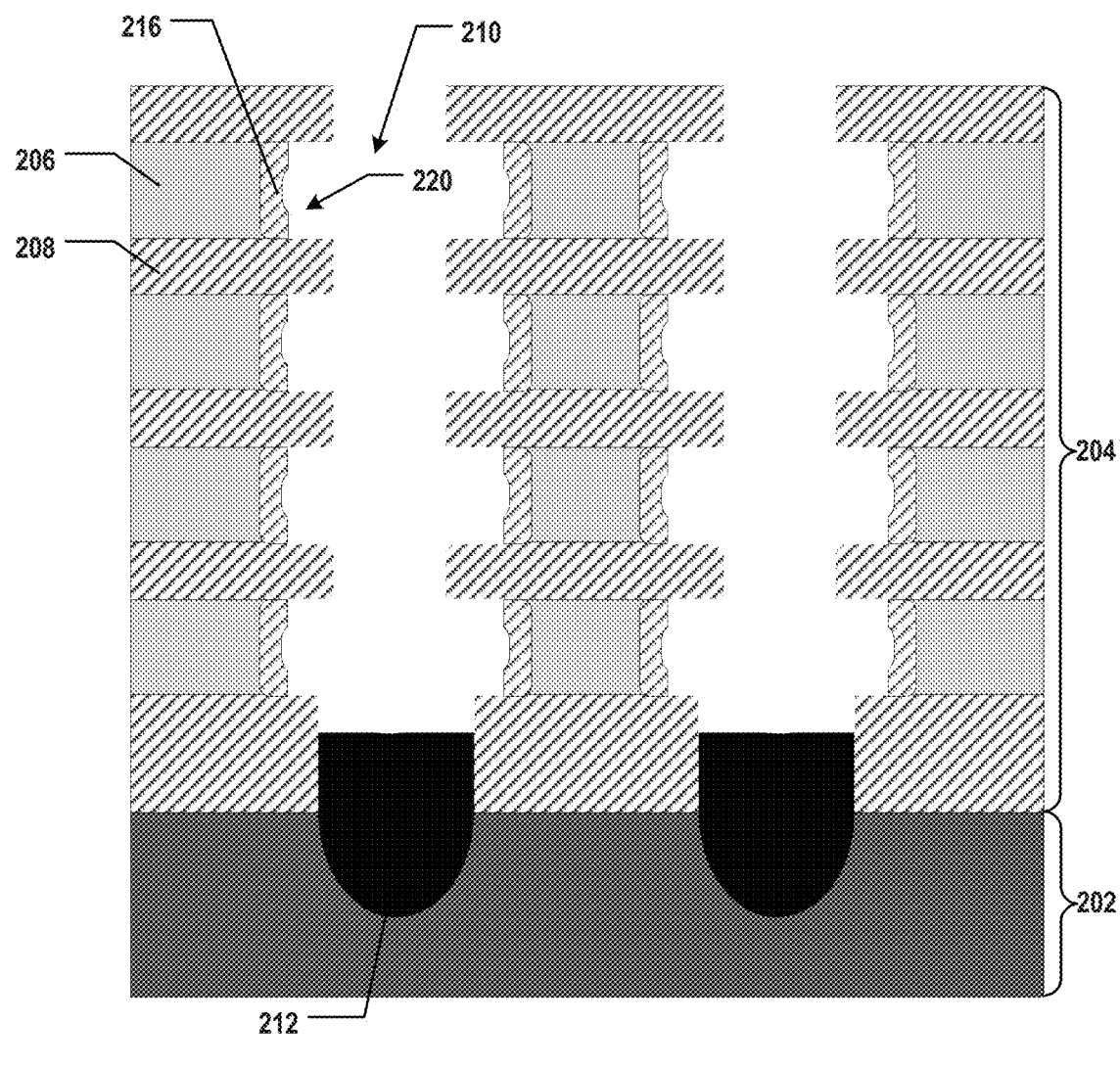

Method 601 proceeds to operation 611, as illustrated in FIG. 6B, in which a remainder of the first sacrificial layer along the sidewalls of the recesses is oxidized. As illustrated in FIG. 4E, remainder 404' of sacrificial layer 404 (e.g., shown in FIG. 4D) is removed, for example, by wet etching remainder 404' of sacrificial layer 404 selective to remainder 402' of sacrificial layer 402 and dielectric layers 208. As illustrated in FIG. 4F, remainder 402' of sacrificial layer 402 along the sidewalls of recesses 220 is oxidized to form blocking structures 216. The oxidation process can be performed by a thermal oxidation process and or a chemical oxidation process. The oxidation process can be performed in a controlled manner such that only remainder 402' of sacrificial layer 402 is oxidized, leaving sacrificial layers 206 intact, as described above in detail. It is understood that the process described above for forming blocking structures 216 with respect to FIGS. 4A-4F and 6B may be similarly applied to another type of stack structure including vertically interleaved dielectric layers 208 and the conductive layers as well.

Referring back to FIG. 5, method 500 proceeds to operation 510, as illustrated in FIG. 5, in which a plurality of storage structures are formed over the blocking structures, respectively, such that a vertical dimension of each of the blocking structures is nominally the same as a vertical dimension of a respective one of the storage structures over the blocking structure. In some embodiments, to form the plurality of storage structures, a storage layer is formed along sidewalls of the opening, top and bottom surfaces of the recesses, and the sidewalls of the recesses over the blocking structures, and part of the storage layer is removed.

Figure 2D:
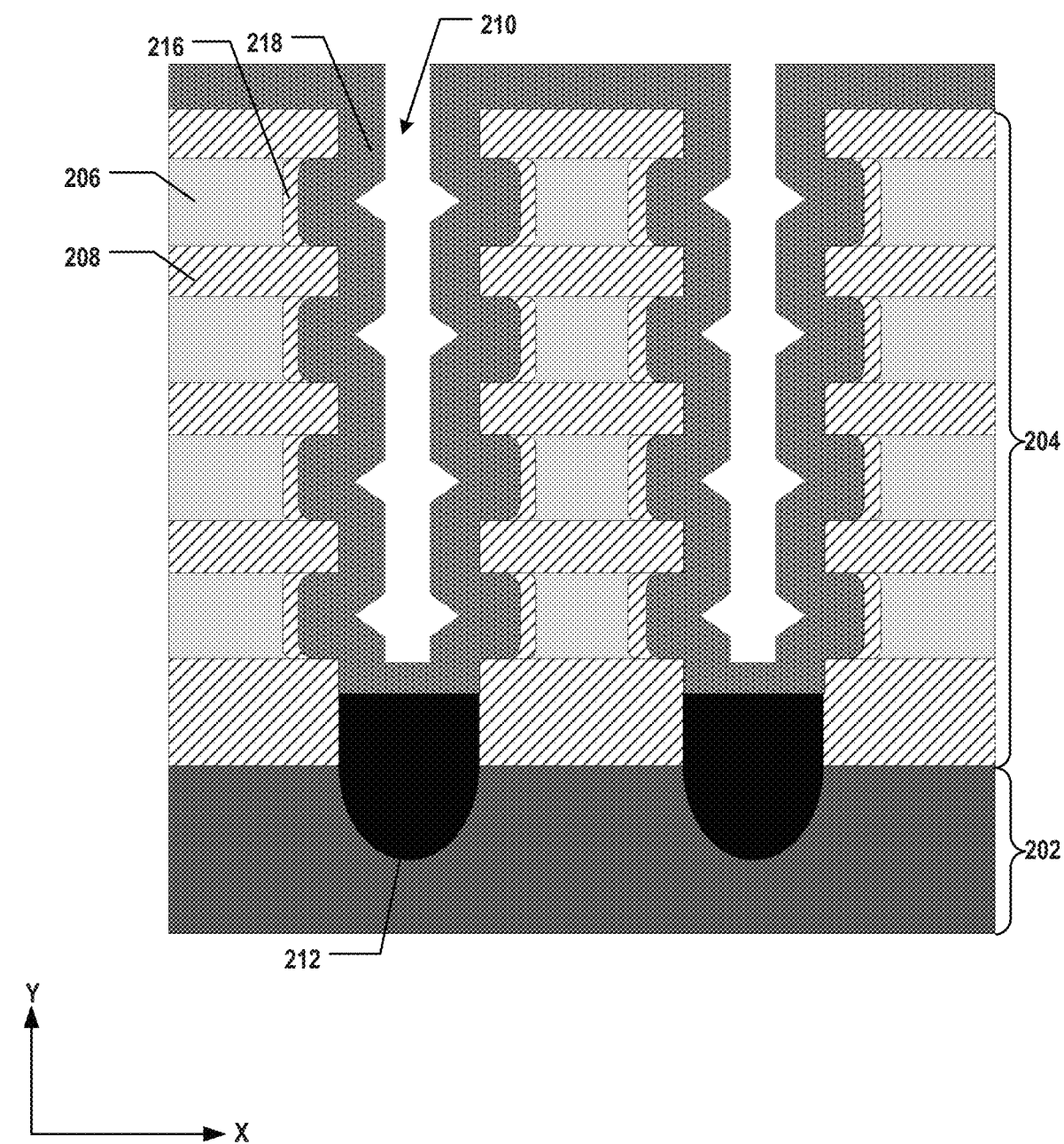

As illustrated in FIG. 2D, a storage layer 218 is formed along the sidewalls of opening 210, the top and bottom surfaces of recesses 220 (e.g., shown in FIG. 2C), and the sidewalls of recesses 220 over blocking structures 216. In some embodiments, storage layer 218 can be formed by depositing a layer of silicon nitride using one or more thin film deposition processes, such as ALD, CVD, PVD, any other suitable processes, or any combination thereof through opening 210. In some embodiments, an ALD process is used to precisely control the thickness of storage layer 218. For example, the thickness of storage layer 218 is nominally the same along the sidewalls of opening 210 and the sidewalls and top and bottom surfaces of recesses 220. In some embodiments, the thickness of storage layer 218 is nominally one half of the depth of each recess 220, e.g., in the y-direction in FIG. 2D, to fully fill recess 220 in the vertical direction. On the other hand, blocking structure 216 and storage layer 218 may also fully fill recess 220 in the lateral direction, e.g., the x-direction in FIG. 2D. In some embodiments, the thickness of storage layer 218 is between about 5 nm and about 20 nm, such as between 5 nm and 20 nm (e.g., 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, any range bounded by the lower end by any of these values, or in any range defined by any two of these values).

Figure 2E:
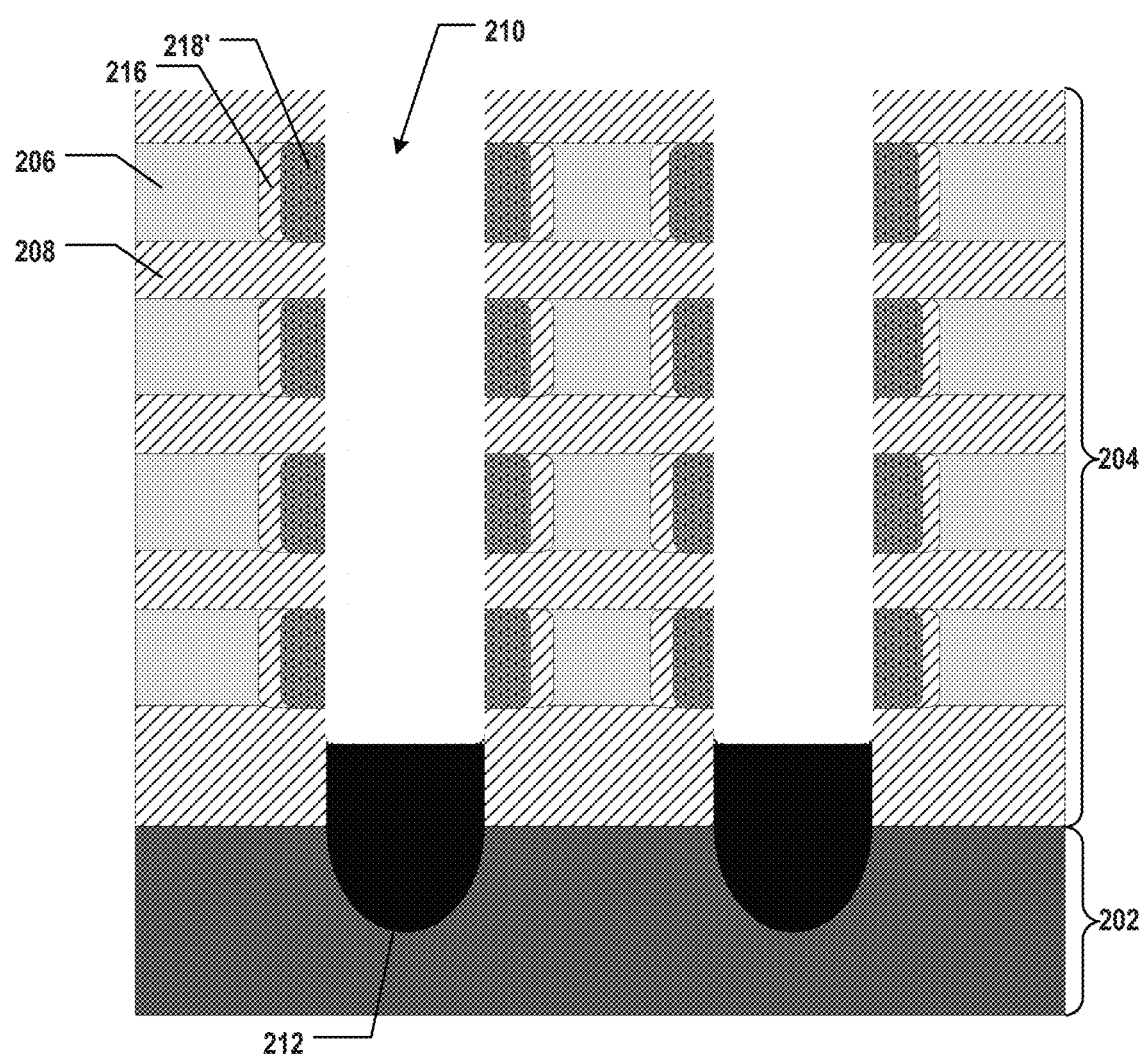

As illustrated in FIG. 2E, part of storage layer 218 (e.g., shown in FIG. 2D) along the sidewall of opening 210 is removed, leaving the remainder of storage layer 218 in recesses 220 (e.g., shown in FIG. 2C) to form storage structures 218' over blocking structures 216, respectively. Since storage layer 218 can fully fill recesses 220, the remainder of storage layer 218 in recesses 220 after etching, i.e., each storage structure 218', can have nominally the same vertical dimension as a respective blocking structure 216. In some embodiments, to remove the part of storage layer 218, storage layer 218 is wet etched selective to dielectric layers 208. In some embodiments in which storage layer 218 includes silicon nitride and dielectric layers 208 include silicon oxide, a wet etchant including phosphoric acid is applied through opening 210 to etch storage layer 218. The etching rate and/or etching time can also be controlled such that the part of storage layer 218 along the sidewalls of opening 210 is removed, leaving storage structures 218' in recesses 220 intact.

Figure 7:
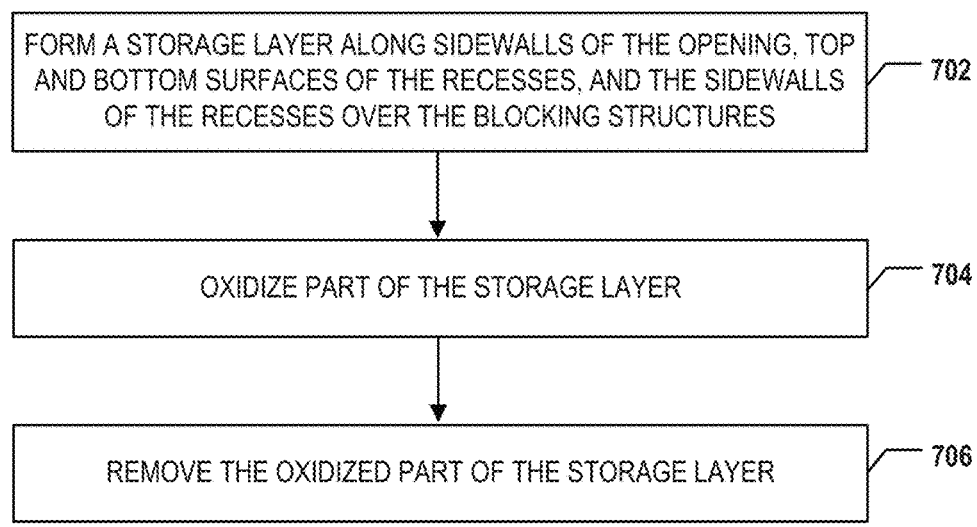
FIG. 7 illustrates a flowchart of an exemplary method for forming storage structures in a 3D memory device, according to some embodiments of the present disclosure.

The formation of the storage structures over the blocking structures is not limited by the example described above. FIG. 7 illustrates a flowchart of an exemplary method 700 for forming the storage structures in a 3D memory device, according to some embodiments of the present disclosure. At operation 702, a storage layer is formed along sidewalls of the opening, top and bottom surfaces of the recesses, and the sidewalls of the recesses over the blocking structures.

In some embodiments, oxidizing is performed by at least one of thermal oxidation or chemical oxidation. The thermal oxidation can include ISSG. The oxidation process can be performed in a controlled manner such that only part of storage layer 218 is oxidized, leaving the remainder of storage layer 218 remains intact. The thickness of the resulting native oxide (and the remainder of storage layer 218) can be controlled by the thermal oxidation temperature and/or time. In some embodiments, the part of storage layer 218 is oxidized by a chemical oxidation process, for example, including ozone. In some embodiments, the wet chemical is a mixture of hydrofluoric acid and ozone (e.g., FOM). The thickness of resulting native oxide can be controlled by the wet chemical compositions, temperature, and/or time. It is understood that the oxidation rates of storage layer 218 may vary at different parts thereof, for example, slower in recesses 220 (facing sacrificial layers 206) and faster outside recesses 220 (in FIG. 2D, facing dielectric layers 208) and along the sidewall of opening 210, due to the convex and concave structures in recesses 220. As a result, the sidewall roughness of the remainder of storage layer 218 may be reduced after the oxidation process.

In some embodiments, the oxidization process is controlled such that the remainder of storage layer 218 after oxidation includes two portions with different thicknesses (e.g., in the x-direction): storage structures 218' in recesses 220 and over blocking structures 216, and protecting structures (not shown in FIG. 2E, e.g., protecting structures 118B in FIG. 1B) outside of recesses 220 and facing dielectric layers 208. The thickness of storage structures 218' can be greater than that of the protecting structure due to recesses 220. In some embodiments, the oxidation process is controlled to leave the protecting structures of the remainder of storage layer 218 having a thickness of about 2 nm to about 3 nm, which can serve as the etch stop layer to protect dielectric layers 208 underneath in the later processes. The remainder of storage layer 218 after oxidation remains a continuous layer with non-uniform thicknesses, according to some embodiments. In some embodiments, to precisely control the oxidation thickness (and the thickness of the remainder of storage layer 218) as described, multiple oxidation processes are performed with a relatively small oxidation thickness increment each time.

At operation 704, part of the storage layer is oxidized. At operation 706, the oxidized part of the storage layer is removed. In some embodiments, to remove the oxidized part of the storage layer, the oxidized part of the storage layer is wet etched selective to the remainder of the storage layer. In some embodiments, the storage layer includes silicon nitride, and an etchant used by the wet etching includes hydrofluoric acid. In some embodiments, the remainder of the storage layer includes storage structures 218' in recesses 220 and over blocking structures 216, and protecting structures (not shown in FIG. 2E, e.g., protecting structures 118B in FIG. 1B) outside of recesses 220 and facing dielectric layers 208. It is understood that the various processes described above for forming storage structures 218' with respect to FIGS. 2D and 2E and FIG. 7 may be similarly applied to another type of stack structure including vertically interleaved dielectric layers 208 and the conductive layers as well.

Figure 2F:
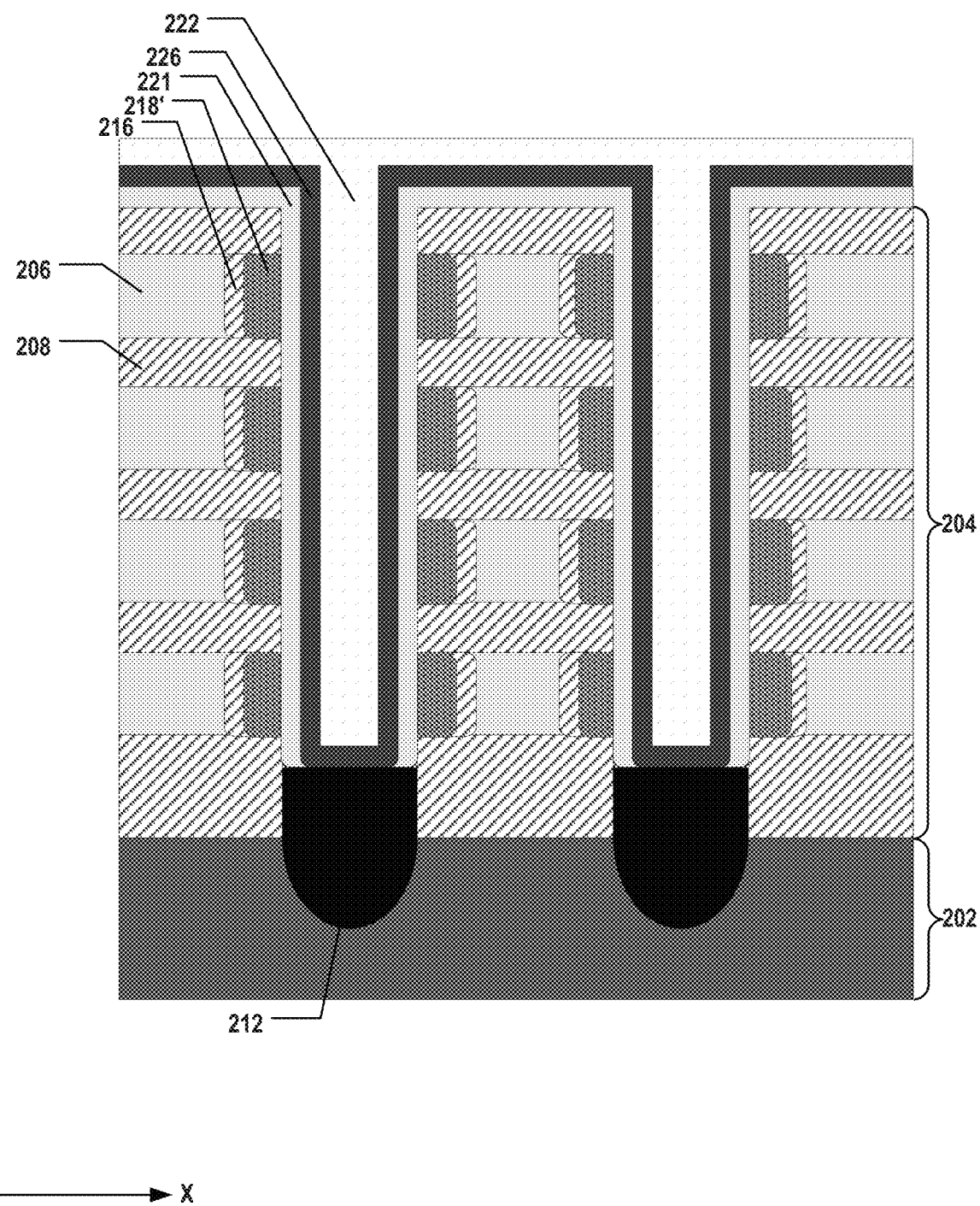

Referring back to FIG. 5, method 500 proceeds to operation 512, in which a tunneling layer and a semiconductor channel are sequentially formed over the storage structures. As illustrated in FIG. 2F, a tunneling layer 221 and a semiconductor channel 226 are sequentially formed over storage structures 218'. In some embodiments, a layer of silicon oxide and a layer of polysilicon are sequentially deposited over storage structures 218' using one or more thin film deposition processes including, but not limited to, PVD, CVD, ALD, or any combination thereof. In some embodiments, the bottom of tunneling layer 221 is etched through before depositing polysilicon for semiconductor channel 226, such that a bottom portion of semiconductor channel 226 is in contact with single crystalline silicon plug 212. As illustrated in FIG. 2F, in some embodiments, a capping layer 222 is formed over semiconductor channel 226 to partially or fully fill opening 210 (in FIG. 2E) by depositing a layer of silicon oxide into opening 210 using one or more thin film deposition processes including, but not limited to, PVD, CVD, ALD, or any combination thereof.

Figure 2G:
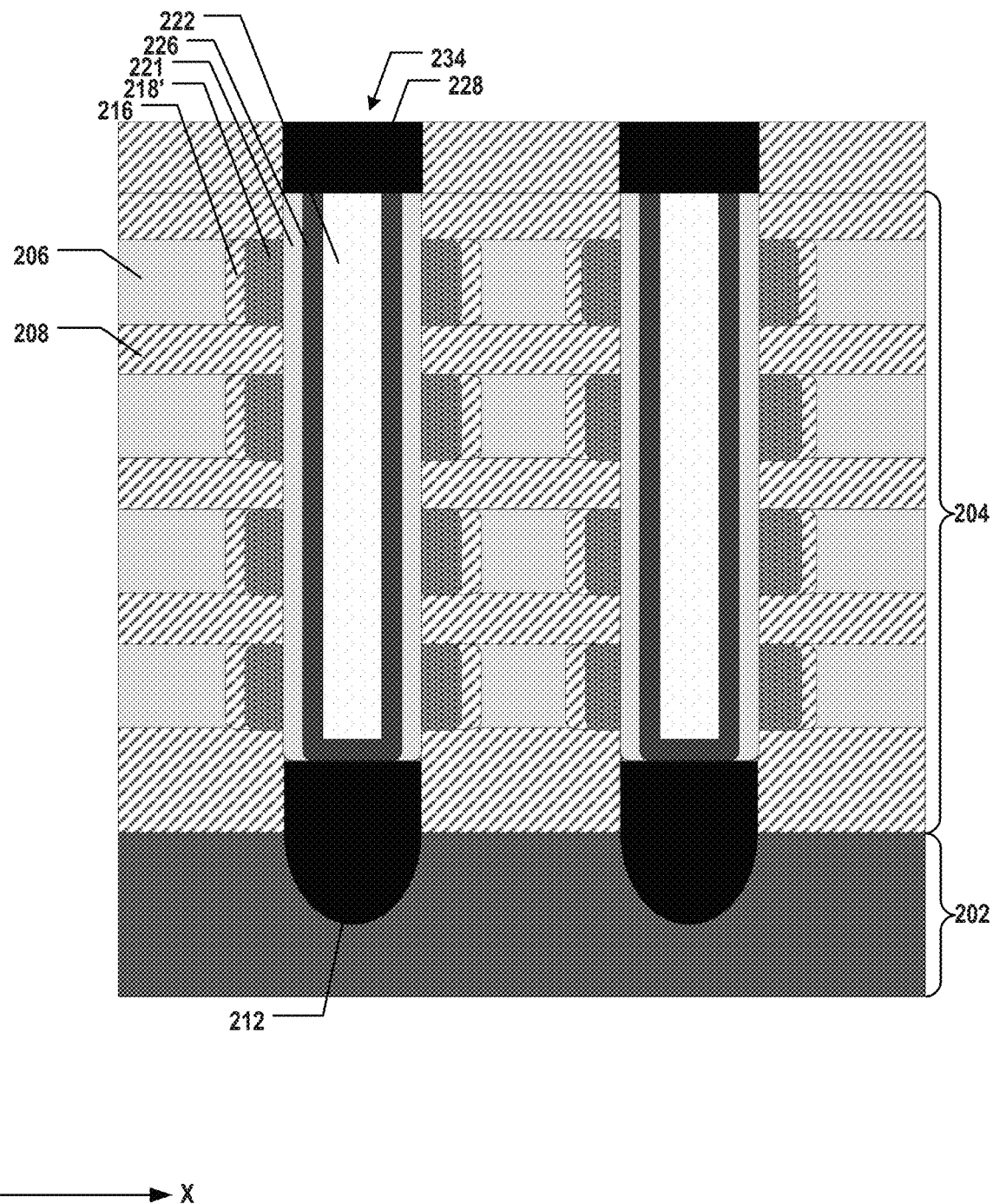

As illustrated in FIG. 2G, a channel plug 228 is formed above and in contact with semiconductor channel 226, for example, by etching back the top portions of semiconductor channel 226, capping layer 222, and tunneling layer 221 and filling the etched back portions with a layer of polysilicon. As shown in FIG. 2G, a channel structure 234 including channel plug 228, single crystalline silicon plug 212, blocking structures 216, storage structures 218', tunneling layer 221, and semiconductor channel 226 is thereby formed through dielectric stack 204, according to some embodiments. It is understood that the processes described above for forming channel structures with respect to FIGS. 2F and 2G may be similarly applied to another type of stack structure including vertically interleaved dielectric layers 208 and the conductive layers as well.

In some embodiments, a gate-replacement process is further performed to replace dielectric stack 204 with a memory stack (e.g., memory stack 104 in FIGS. 1A and 1B). In some embodiments, sacrificial layers 206 (e.g., silicon nitride layers) are removed by, for example, wet etching, to form a plurality of lateral recesses (not shown) vertically between dielectric layers 208. In some embodiments, etchants are applied through slit openings (not shown) to selectively etch silicon nitride of sacrificial layers 206 against silicon oxide of dielectric layers 208. The etching of sacrificial layers 206 having silicon nitride can be stopped by blocking structures 216 having silicon oxide to prevent further damage to channel structure 234. Conductive layers (e.g., tungsten layers) can then be deposited to fill the lateral recesses using one or more thin film deposition processes, such as CVD, PVD, ALD, electroplating, electroless plating, or any combination thereof through the slit openings. The memory stack is thereby formed with interleaved dielectric layers 208 and the conductive layers, according to some embodiments. It is understood that the gate-replacement process may not be necessary for another type of stack structure including vertically interleaved dielectric layers 208 and the conductive layers.

According to one aspect of the present disclosure, a 3D memory device includes a memory stack including conductive layers and dielectric layers interleaving the conductive layers, and a channel structure extending through the memory stack along a vertical direction. The channel structure has a plurality of protruding portions protruding along a lateral direction and facing the conductive layers, respectively, and a plurality of normal portions facing the dielectric layers, respectively, without protruding along the lateral direction. The channel structure includes a plurality of blocking structures in the protruding portions, respectively, and a plurality of storage structures in the protruding portions and over the plurality of blocking structures, respectively. A vertical dimension of each of the blocking structures is nominally the same as a vertical dimension of a respective one of the storage structures over the blocking structure.

In some embodiments, the plurality of blocking structures are disconnected from one another in the normal portions of the channel structure.

In some embodiments, each of the storage structures is in contact with a respective pair of the dielectric layers along the vertical direction.

In some embodiments, the vertical dimension of each of the storage structures is nominally the same as a vertical dimension of a respective one of the conductive layers.

In some embodiments, the channel structure further includes a plurality of protecting structures connecting the plurality of storage structures in the normal portions of the channel structure.

In some embodiments, the blocking structures include silicon oxide, and the storage structures include silicon nitride.

In some embodiments, the channel structure further includes a tunneling layer over the storage structures, and a semiconductor channel over the tunneling layer.

According to another aspect of the present disclosure, a 3D memory device includes a memory stack including conductive layers and dielectric layers interleaving the conductive layers, and a channel structure extending through the memory stack along a vertical direction. The channel structure includes a plurality of blocking structures disconnected from one another, and a plurality of storage structures over the plurality of blocking structures, respectively. Each of the storage structures extends between a respective pair of the dielectric layers and is in parallel with a respective one of the blocking structures.

In some embodiments, each of the storage structures is in contact with the respective pair of the dielectric layers along the vertical direction.

In some embodiments, a vertical dimension of each of the blocking structures is nominally the same as a vertical dimension of a respective one of the storage structures over the blocking structure.

In some embodiments, the vertical dimension of each of the storage structures is nominally the same as a vertical dimension of a respective one of the conductive layers.

In some embodiments, the blocking structures include silicon oxide, and the storage structures include silicon nitride.

In some embodiments, the channel structure further includes a tunneling layer over the storage structures, and a semiconductor channel over the tunneling layer.

According to still another aspect of the present disclosure, a method for forming a 3D memory device is disclosed. A stack structure including first layers and second layers interleaving the first layers is formed above a substrate. An opening extending through the stack structure along a vertical direction is formed. Parts of the second layers facing the opening are removed to form a plurality of recesses. A plurality of blocking structures are formed along sidewalls of the recesses. A plurality of storage structures are formed over the blocking structures, respectively, such that a vertical dimension of each of the blocking structures is nominally the same as a vertical dimension of a respective one of the storage structures over the blocking structure.

In some embodiments, to form the plurality of blocking structures, parts of remainders of the second layers facing the sidewalls of the recesses are oxidized.

In some embodiments, to form the plurality of blocking structures, a first sacrificial layer is formed along sidewalls of the opening and the sidewalls and top and bottom surfaces of the recesses, part of the first sacrificial layer along the sidewalls of the opening and the top and bottom surfaces of the recesses is removed, and a remainder of the first sacrificial layer along the sidewalls of the recesses is oxidized.

In some embodiments, the first sacrificial layer includes silicon nitride.

In some embodiments, to remove the part of the first sacrificial layer, the part of the first sacrificial layer is wet etched selective to the first layers.

In some embodiments, to form the plurality of blocking structures, a first sacrificial layer is formed along sidewalls of the opening and the sidewalls and top and bottom surfaces of the recesses, a second sacrificial layer is formed over the first sacrificial layer, part of the second sacrificial layer is removed, leaving a remainder of the second sacrificial layer in the recesses, to expose part of the first sacrificial layer along the sidewalls of the opening and the top and bottom surfaces of the recesses, the exposed part of the first sacrificial layer is removed, and a remainder of the first sacrificial layer along the sidewalls of the recesses is oxidized.

In some embodiments, the first sacrificial layer includes silicon nitride, and the second sacrificial layer includes polysilicon.

In some embodiments, to remove the part of the second sacrificial layer, the part of the second sacrificial layer is wet etched selective to the first sacrificial layer. In some embodiments, to remove the exposed part of the first sacrificial layer, the exposed part of the first sacrificial layer is wet etched selective to the remainder of the second sacrificial layer and the first layers.

In some embodiments, to form the plurality of storage structures, a storage layer is formed along sidewalls of the opening, top and bottom surfaces of the recesses, and the sidewalls of the recesses over the blocking structures, part of the storage layer is oxidized, and the oxidized part of the storage layer is removed.

In some embodiments, to form the plurality of storage structures, a storage layer is formed along sidewalls of the opening, top and bottom surfaces of the recesses, and the sidewalls of the recesses over the blocking structures, and part of the storage layer is removed.

In some embodiments, the storage layer includes silicon nitride.

In some embodiments, to remove the parts of the second layers, the parts of the second layers are wet etched selective to the first layers.

In some embodiments, the first layers include silicon oxide, and the second layers include silicon nitride.

In some embodiments, after forming the plurality of storage structures, a tunneling layer and a semiconductor channel are sequentially formed over storage structures.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments but should be defined only in accordance with the following claims and their equivalents.

What is claimed is:

1. A three-dimensional (3D) memory device, comprising:
a memory stack comprising conductive layers and dielectric layers interleaving the conductive layers; and
a channel structure extending through the memory stack along a vertical direction, the channel structure having a plurality of protruding potions protruding along a lateral direction and facing the conductive layers, respectively, and a plurality of normal portions facing the dielectric layers, respectively, without protruding along the lateral direction, the channel structures comprising:
- a plurality of blocking structures in the protruding portions, respectively; and
- a plurality of storage structures in the protruding portions and over the plurality of blocking structures, respectively,
- wherein a vertical dimension of each of the blocking structures is nominally the same as a vertical dimension of a respective one of the storage structures over the blocking structure.

2. The 3D memory device of claim 1, wherein the plurality of blocking structures are disconnected from one another in the normal portions of the channel structure.

3. The 3D memory device of claim 1, wherein each of the storage structures is in contact with a respective pair of the dielectric layers along the vertical direction.

4. The 3D memory device of claim 1, wherein the vertical dimension of each of the storage structures is nominally the same as a vertical dimension of a respective one of the conductive layers.

5. The 3D memory device of claim 1, wherein the channel structure further comprises a plurality of protecting structures connecting the plurality of storage structures in the normal portions of the channel structure.

6. The 3D memory device of claim 1, wherein the blocking structures comprise silicon oxide, and the storage structures comprise silicon nitride.

7. The 3D memory device of claim 1, wherein the channel structure further comprises a tunneling layer over the storage structures, and a semiconductor channel over the tunneling layer.

8. The memory device of claim 1, wherein one of the storage structures is in direct contact with a respective pair of the dielectric layers.

9. A three-dimensional (3D) memory device, comprising:
- a memory stack comprising conductive layers and dielectric layers interleaving the conductive layers; and
- a channel structure extending through the memory stack along a vertical direction and comprising:
  - a plurality of blocking structures disconnected from one another; and
  - a plurality of storage structures over the plurality of blocking structures, respectively, wherein:
    - each of the storage structures extends between a respective pair of the dielectric layers and is in parallel with a respective one of the blocking structures; and
    - one of the storage structures is in direct contact with a corresponding pair of the dielectric layers along the vertical direction.

10. The 3D memory device of claim 9, wherein each of the storage structures is in contact with the respective pair of the dielectric layers along the vertical direction.

11. The 3D memory device of claim 9, wherein a vertical dimension of each of the blocking structures is nominally the same as a vertical dimension of a respective one of the storage structures over the blocking structure.

12. The 3D memory device of claim 11, wherein the vertical dimension of each of the storage structures is nominally the same as a vertical dimension of a respective one of the conductive layers.

13. A method for forming a three-dimensional (3D) memory device, comprising:
- forming a stack structure above a substrate, the stack structure comprising first layers and second layers interleaving the first layers;
- forming an opening extending through the stack structure along a vertical direction;
- removing parts of the second layers facing the opening to form a plurality of recesses;
- forming a plurality of blocking structures along sidewalls of the recesses; and
- forming a plurality of storage structures over the blocking structures, respectively, comprising:
  - forming a storage layer along sidewalls of the opening, top and bottom surfaces of the recesses, and the sidewalls of the recesses over the blocking structures; and
  - removing part of the storage layer,
- wherein a vertical dimension of each of the blocking structures is nominally the same as a vertical dimension of a respective one of the storage structures over the blocking structure.

14. The method of claim 13, wherein forming the plurality of blocking structures comprises oxidizing parts of remainders of the second layers facing the sidewalls of the recesses.

15. The method of claim 13, wherein forming the plurality of blocking structures comprises:
- forming a first sacrificial layer along sidewalls of the opening and the sidewalls and top and bottom surfaces of the recesses;
- removing part of the first sacrificial layer along the sidewalls of the opening and the top and bottom surfaces of the recesses; and
- oxidizing a remainder of the first sacrificial layer along the sidewalls of the recesses.

16. The method of claim 15, wherein removing the part of the first sacrificial layer comprises wet etching the part of the first sacrificial layer selective to the first layers.

17. The method of claim 13, forming the plurality of blocking structures comprises:
- forming a first sacrificial layer along sidewalls of the opening and the sidewalls and top and bottom surfaces of the recesses;
- forming a second sacrificial layer over the first sacrificial layer;
- removing part of the second sacrificial layer, leaving a remainder of the second sacrificial layer in the recesses, to expose part of the first sacrificial layer along the sidewalls of the opening and the top and bottom surfaces of the recesses;
- removing the exposed part of the first sacrificial layer; and
- oxidizing a remainder of the first sacrificial layer along the sidewalls of the recesses.

18. The method of claim 17, wherein
- removing the part of the second sacrificial layer comprises wet etching the part of the second sacrificial layer selective to the first sacrificial layer; and
- removing the exposed part of the first sacrificial layer comprises wet etching the exposed part of the first sacrificial layer selective to the remainder of the second sacrificial layer and the first layers.

19. The method of claim 13, further comprising:
- oxidizing part of the storage layer wherein removing the part of the storage layer comprises removing the oxidized part of the storage layer.

20. The method of claim 13, wherein removing the parts of the second layers comprises wet etching the parts of the second layers selective to the first layers.

* * * * *